United States Patent
Kim et al.

(10) Patent No.: US 11,600,334 B2
(45) Date of Patent: Mar. 7, 2023

(54) MEMORY CONTROLLER

(71) Applicant: SK hynix Inc., Gyeonggi-do (KR)

(72) Inventors: Dong Hyun Kim, Gyeonggi-do (KR); Seung Il Kim, Chungcheongbuk-do (KR); Youn Ho Jung, Chungcheongbuk-do (KR); Min Ho Her, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 209 days.

(21) Appl. No.: 16/353,585

(22) Filed: Mar. 14, 2019

(65) Prior Publication Data

US 2020/0051643 A1    Feb. 13, 2020

(30) Foreign Application Priority Data

Aug. 8, 2018   (KR) .......................... 10-2018-0092142

(51) Int. Cl.
*G11C 16/16* (2006.01)
*G11C 16/12* (2006.01)
*G11C 16/08* (2006.01)

(52) U.S. Cl.
CPC .............. *G11C 16/16* (2013.01); *G11C 16/08* (2013.01); *G11C 16/12* (2013.01)

(58) Field of Classification Search
CPC .......... G11C 16/16; G11C 29/00; G11C 16/10
See application file for complete search history.

(56) References Cited

U.S. PATENT DOCUMENTS

| | | | | |
|---|---|---|---|---|
| 5,978,941 A | * | 11/1999 | Katayama | G11C 16/14 714/721 |
| 6,269,025 B1 | * | 7/2001 | Hollmer | G11C 5/147 365/185.29 |
| 2012/0144145 A1 | * | 6/2012 | Shin | G11C 16/349 711/166 |
| 2012/0243329 A1 | * | 9/2012 | Nagashima | G11C 16/10 365/185.22 |

FOREIGN PATENT DOCUMENTS

KR    10-2009-0068614    6/2009
KR    10-2016-0053845    5/2016

* cited by examiner

*Primary Examiner* — Michelle T Bechtold
(74) *Attorney, Agent, or Firm* — IP & T Group LLP

(57) ABSTRACT

In a memory controller for controlling a memory device including a memory block coupled to a plurality of word lines, the memory block including a plurality of memory cells respectively coupled to the plurality of word lines, the memory controller comprising: an operating time calculator configured to calculate program operating times taken to perform a program operation on the memory cells respectively coupled to the plurality of word lines; and an operating voltage determiner configured to determine an erase voltage to be used to erase a memory block by comparing a first program operating time, among the program operating times calculated by the operating time calculator, with the other program operating times, except the first program operating time, among the program operating times.

11 Claims, 18 Drawing Sheets

FIG. 10

BLK 1

| WL | PROGRAM OPERATING TIME (tPROG) |
|---|---|
| 1 | tREF |
| 2 | t12 |
| 3 | t13 |
| ⋮ | ⋮ |
| n | t1n |

BLK z

| WL | PROGRAM OPERATING TIME (tPROG) |
|---|---|
| 1 | |
| 2 | |
| 3 | |
| ⋮ | |
| n | |

| BLK 1 | tBERS1 | ΔtBERS1 |
|---|---|---|
| BLK 2 | tBERS2 | ΔtBERS2 |
| BLK 3 | tBERS3 | ΔtBERS3 |
| ⋮ | ⋮ | ⋮ |
| BLK z | tBERSz | ΔtBERSz |

| RANGE OF ΔtBERS | Offset |
|---|---|
| ΔtBERS < x1 | Vpgm1 |
| x1 ≤ ΔtBERS < x2 | Vpgm2 |
| x2 ≤ ΔtBERS < x3 | Vpgm3 |
| ⋮ | ⋮ |

FIG. 13
| RANGE OF tREP−tREF | Offset |
|---|---|
| tREP− tREF < y1 | Vers1 |
| y1 ≤ tREP− tREF < y2 | Vers2 |
| y2 ≤ tREP− tREF < y3 | Vers3 |
| ⋮ | ⋮ |
FIG. 14
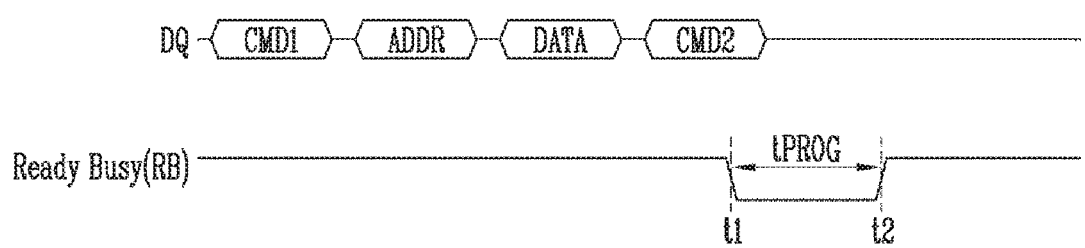
FIG. 15
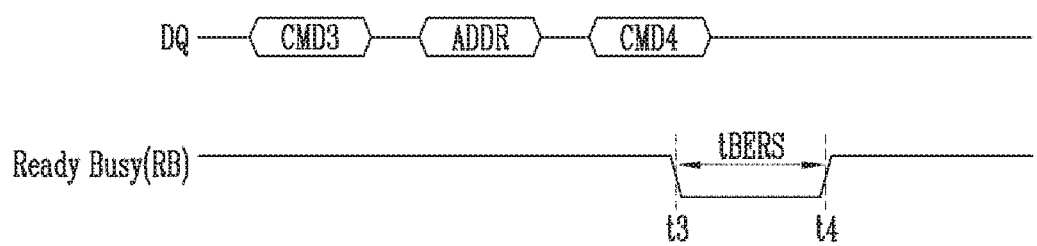

MEMORY CONTROLLER

CROSS-REFERENCE TO RELATED APPLICATION

The present application claims priority under 35 U.S.C. § 119(a) to Korean patent application number 10-2018-0092142, filed on Aug. 8, 2018, which is incorporated herein by reference in its entirety.

BACKGROUND

Field of Invention

The present disclosure generally relates to an electronic device, and more particularly, to a memory controller.

Description of Related Art

A storage device stores data under the control of a host device such as a computer, a smart phone or a smart pad. The storage device includes a device for storing data on a magnetic disk, such as a Hard Disk Drive (HDD), or a device for storing data on a semiconductor memory, i.e., a nonvolatile memory, such as a Solid State Drive (SSD) or a memory card.

The storage device may include a memory device for storing data and a memory controller for controlling the memory device. The memory device may be a volatile memory device or a nonvolatile memory device. Examples of a nonvolatile memory device include a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like.

SUMMARY

Embodiments provide a memory controller having improved reliability.

In accordance with an aspect of the present disclosure, there is provided a memory controller for controlling a memory device including a memory block, the memory block including a plurality of memory cells respectively coupled to a plurality of word lines, the memory controller comprising: an operating time calculator configured to calculate program operating times taken to perform a program operation on the memory cells respectively coupled to the plurality of word lines; and an operating voltage determiner configured to determine an erase voltage to be used to erase a memory block by comparing a first program operating time, among the program operating times calculated by the operating time calculator, with the other program operating times, except the first program operating time, among the program operating times.

In accordance with another aspect of the present disclosure, there is provided a memory controller for controlling a memory device including a plurality of memory blocks wherein the first program operating time is with respect to memory cells coupled to a first word line, which are programmed first, among the plurality of memory cells respectively coupled to the plurality of word lines, and wherein the memory controller further comprises: an operating time storage configured to store program operating times for the memory cells respectively coupled to the plurality of word lines for the respective word lines; and a lookup table configured to include an erase voltage according to a difference value between the first program operating time and an average value of program operating times of memory cells coupled to word lines except the first word line.

In accordance with still another aspect of the present disclosure, there is provided a memory controller for controlling a memory device including a plurality of memory blocks wherein the program operating time is calculated from a start time of the program operation to an end time of the program operation, using confirm command information acquired in the memory controller and ready busy information or status information acquired from the memory device.

In accordance with still another aspect of the present disclosure, there is provided a memory controller for controlling a memory device including a plurality of memory blocks wherein the confirm command information includes information on a time at which the memory controller provides a confirm command to the memory device, and wherein the operating time calculator determines the time at which the confirm command is provided to the memory device as the start time of the program operation.

In accordance with still another aspect of the present disclosure, there is provided a memory controller for controlling a memory device including a plurality of memory blocks wherein the ready busy information includes information on a ready busy signal representing whether the state of the memory device is a ready state or busy state, and wherein the operating time calculator determines a time at which the ready busy signal is changed from the busy state to the ready state as the end time of the program operation.

In accordance with still another aspect of the present disclosure, there is provided a memory controller for controlling a memory device including a plurality of memory blocks wherein the status information is included in a status read response that the memory device provides to the memory controller in response to a status read command for requesting information on the state of the memory device, which is provided by the memory controller.

In accordance with still another aspect of the present disclosure, there is provided a memory controller for controlling a memory device including a plurality of memory blocks wherein the status information includes fail information representing whether the program operation performed by the memory device has passed or failed and ready information representing whether the state of the memory device is the ready state or busy state.

In accordance with still another aspect of the present disclosure, there is provided a memory controller for controlling a memory device including a plurality of memory blocks wherein, when the fail information represents that the program operation of the memory device has passed, and the ready information represents the ready state of the memory device, the operating time calculator determines a time at which the memory device provides the status information to the memory controller as the end time of the program operation.

In accordance with still another aspect of the present disclosure, there is provided a memory controller for controlling a memory device including a plurality of memory blocks wherein the operating time storage stores the first program operating time as a program operating time reference value.

In accordance with still another aspect of the present disclosure, there is provided a memory controller for controlling a memory device including a plurality of memory blocks wherein the operating time determiner determines an erase voltage for the memory device according to a difference value between an average value of program operating times of memory cells coupled to word lines except the first word line and the program operating time reference value.

In accordance with still another aspect of the present disclosure, there is provided a memory controller for controlling a memory device wherein the lookup table further includes an offset voltage that is added to or subtracted from a set default erase voltage according to a range in which the difference value occupies.

In accordance with still another aspect of the present disclosure, there is provided a memory controller for controlling a memory device including a plurality of memory blocks wherein the operating time determiner determines the erase voltage by adding the offset voltage to the set default erase voltage when the difference value is less than 0, and determines the erase voltage by subtracting the offset voltage from the set default erase voltage when the difference value is greater than 0.

In accordance with still another aspect of the present disclosure, there is provided a memory controller for controlling a memory device including a plurality of memory blocks, the memory controller comprising: an operating time calculator configured to calculate times taken to perform an erase operation on the respective memory blocks; and an operating voltage determiner configured to determine a program voltage to be used to program memory cells in each of the plurality of memory blocks based on the times taken to perform the erase operation on the respective memory blocks.

In accordance with still another aspect of the present disclosure, there is provided a memory controller for controlling a memory device including a plurality of memory blocks further comprising: an operating time storage configured to store erase operating times taken to perform the erase operation on the respective memory blocks; and a lookup table configured to include a program voltage according to a difference value between erase operating times taken to perform the erase operation on the respective memory blocks a first time and an erase operating time taken to perform the erase operation on a corresponding memory block a subsequent time.

In accordance with still another aspect of the present disclosure, there is provided a memory controller for controlling a memory device including a plurality of memory blocks wherein the erase operating time is calculated from a start time of the erase operation to an end time of the erase operation, using confirm command information acquired in the memory controller and busy information and status information acquired from the memory device.

In accordance with still another aspect of the present disclosure, there is provided a memory controller for controlling a memory device including a plurality of memory blocks wherein the confirm command information includes information on a time at which the memory controller provides a confirm command to the memory device, and wherein the operating time calculator determines the time at which the confirm command is provided to the memory device as the start time of the erase operation.

In accordance with still another aspect of the present disclosure, there is provided a memory controller for controlling a memory device including a plurality of memory blocks wherein the ready busy information includes information on a ready busy signal representing whether the state of the memory device is a ready state or busy state, and wherein the operating time calculator determines a time at which the ready busy signal is changed from the busy state to the ready state as the end time of the erase operation.

In accordance with still another aspect of the present disclosure, there is provided a memory controller for controlling a memory device including a plurality of memory blocks wherein the status information is included in a status read response that the memory device provides to the memory controller in response to a status read command for requesting information on the state of the memory device, which is provided by the memory controller.

In accordance with still another aspect of the present disclosure, there is provided a memory controller for controlling a memory device including a plurality of memory blocks wherein the status information includes fail information representing whether the erase operation performed by the memory device has passed or failed and ready information representing whether the state of the memory device is the ready state or busy state.

In accordance with still another aspect of the present disclosure, there is provided a memory controller for controlling a memory device including a plurality of memory blocks wherein, when the fail information represents that the erase operation of the memory device has passed and the ready information represents the ready state of the memory device, the operating time calculator determines a time at which the memory device provides the status information to the memory controller as the end time of the erase operation.

In accordance with still another aspect of the present disclosure, there is provided a memory controller for controlling a memory device including a plurality of memory blocks wherein the operating time storage stores an erase operating time taken to perform the erase operation on each of the plurality of memory blocks a first time as an erase operating time reference value of the corresponding memory block.

In accordance with still another aspect of the present disclosure, there is provided a memory controller for controlling a memory device including a plurality of memory blocks wherein the operating time determiner determines a program voltage for memory cells in the corresponding memory block based on a difference value between an erase operating time taken to perform the erase operation on any one of the plurality of memory blocks a most recent time and the erase operating time reference value.

In accordance with still another aspect of the present disclosure, there is provided a memory controller for controlling a memory device including a plurality of memory blocks wherein the lookup table includes an offset voltage according to a range in which the difference value occupies, and wherein the offset voltage is added to or subtracted from a set default program voltage.

In accordance with still another aspect of the present disclosure, there is provided a memory controller for controlling a memory device including a plurality of memory blocks wherein the operating time determiner determines the program voltage by adding the offset voltage to the set default program voltage when the difference value is less than 0, and determines the program voltage by subtracting the offset voltage from the set default program voltage when the difference value is greater than 0.

In accordance with still another aspect of the present disclosure, there is provided a memory controller for controlling a memory device including a plurality of memory blocks configured with memory cells and word lines respectively coupled thereto, the memory controller comprising: an operating time calculator configured to calculate operating times taken to perform an operation corresponding to a first command on a selected memory block among the plurality of memory blocks; an operating time storage configured to store a reference operating time among the operating times taken to perform the operation corresponding to the first command; and an operating voltage determiner configured to change a voltage of an operation corresponding to a second command on the selected memory block by comparing a comparison operating time determined after the operation corresponding to the first command is most recently performed on the selected memory block with the reference operating time.

In accordance with still another aspect of the present disclosure, there is provided a memory controller for controlling a memory device, the memory controller comprising: an operating time calculator configured to calculate operating times taken to perform an operation corresponding to a first command on the memory device; an operating time storage configured to store a reference operating time among the operating times taken to perform the operation corresponding to the first command; and an operating voltage determiner configured to change a voltage of an operation corresponding to a second command on the memory device by comparing a comparison operating time determined after the operation corresponding to the first command is performed on the memory device a most recent time, among the operating times.

In accordance with still another aspect of the present disclosure, there is provided a memory system comprising, a memory device including a memory block, an operating time calculator configured to calculate a first operation time most recently taken for the memory device to complete a first operation to the memory block based on operation report information on the first operation provided from the memory device, a lookup table containing one or more items of information on variations of an operation voltage according to variations relating to the first operation time and an operating voltage determiner configured to determine the operation voltage by referring to the first operation time and the items of information in the lookup table, wherein the memory device performs a second operation, of a different type than the first operation, to the memory block with the determined operation voltage.

BRIEF DESCRIPTION OF THE DRAWINGS

Various embodiments will now be described more fully hereinafter with reference to the accompanying drawings. However, elements and features may be configured or arranged differently than disclosed herein. Thus, the present invention is not limited to the embodiments set forth herein. Rather, these embodiments are provided so that this disclosure is thorough and complete and fully conveys the scope of the embodiments to those skilled in the art. Also, throughout the specification, reference to "an embodiment," "another embodiment," and the like is not necessarily to only one embodiment, and different references to any such phrase are not necessarily to the same embodiment(s).

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 10 is a diagram illustrating a program operating time stored in an operating time storage, such as that of FIG. 9.
FIG. 11 is a diagram illustrating an erase operating time stored in the operating time storage, such as that of FIG. 9.
FIG. 12 is a diagram illustrating an offset voltage of a program voltage stored in a lookup table of FIG. 9.
FIG. 13 is a diagram illustrating an offset voltage of an erase voltage stored in a lookup table of FIG. 9.
FIG. 14 is a diagram illustrating a method for measuring a program operating time of memory cells.
FIG. 15 is a diagram illustrating a method for measuring an erase operating time of a memory block.

DETAILED DESCRIPTION

Figure 1:
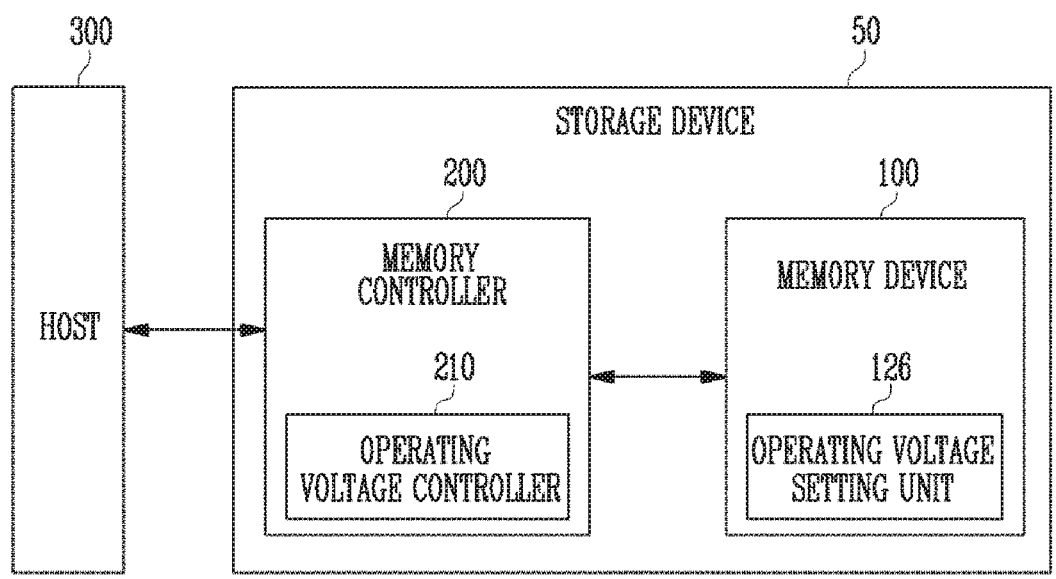
FIG. 1 is a block diagram illustrating a storage device.

The specific structural and functional description herein is for the purpose of describing embodiments of the present disclosure. The embodiments can be implemented in various forms, and thus the present invention is not limited to the embodiments set forth herein.

The embodiments in accordance with the concept of the present disclosure can be variously modified and configured. Thus, while the disclosed embodiments are illustrated and described in detail, the present invention is not limited to the specifics disclosed; rather, the present invention includes all changes, equivalents, or substitutes that do not depart from the spirit and technical scope of the present disclosure.

While terms such as "first" and "second" may be used to identify various components, such components are not limited by the above terms. The above terms are used only to distinguish one component from another that otherwise have the same or similar names. For example, a first component in one instance may be referred to as a second component in another instance without departing from the scope of rights of the present disclosure.

It will be understood that when an element is referred to as being "connected" or "coupled" to another element, it can be directly connected or coupled to the other element or one or more intervening elements may also be present. In contrast, when an element is referred to as being "directly connected" or "directly coupled" to another element, no intervening elements are present. Other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms and vice versa, unless the context clearly indicates otherwise. It will be further understood that terms such as "including" or "having," etc., are intended to indicate the existence of the stated features, numbers, operations, actions, components, parts, or combinations thereof, but are not intended to preclude the possibility that one or more other features, numbers, operations, actions, components, parts, or combinations thereof may exist or may be added.

So far as not being differently defined, all terms used herein including technical or scientific terminologies have meanings that are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

In describing those embodiments, description of techniques that are well known to the applicable art and are not directly related to the present disclosure is omitted. By omitting unnecessary description, the present invention may be understood more clearly.

Various embodiments of the present disclosure will be described in detail with reference to the accompanying drawings in order for those skilled in the art to be able to readily implement the present invention.

FIG. 1 is a block diagram illustrating a storage device.

Referring to FIG. 1, the storage device 50 may include a memory device 100 and a memory controller 200.

The storage device 50 may be a device for storing data under the control of a host 300, such as a mobile phone, a smart phone, an MP3 player, a laptop computer, a desktop computer, a game console, a TV, a tablet PC or an in-vehicle infotainment.

The storage device 50 may be configured as any one of various types of storage devices according to a host interface that is a communication scheme with the host 300. For example, the storage device 50 may be implemented with any one of various types of storage devices such as a multi-media card of a Solid State Drive (SSD), a Multi-Media Card (MMC), an embedded, Multi-Media Card (eMMC), a Reduced Size, Multi-Media Card (RS-MMC), and a micro-Multi-Media Card (micro-MMC) type, a Secure Digital (SD) card of a Secure Digital (SD), a mini-Secure Digital (mini-SD) and a micro-Secure Digital (micro-SD) type, an Universal Serial Bus (USB) storage device, a Universal Flash Storage (UFS) device, a storage device of a Personal Computer Memory Card International Association (PCMCIA) card type, a storage device of a Peripheral Component Interconnection (PCI) card type, a storage device of a PCI-Express (PCI-e) card type, a Compact Flash (CF) card, a smart media card, and a memory stick.

The storage device 50 may be manufactured as any one of various kinds of package types. For example, the storage device 50 may be manufactured as any one of a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates under the control of the memory controller 200. The memory device 100 may include a memory cell array including a plurality of memory cells for storing data. The memory cell array may include a plurality of memory blocks. Each memory block may include a plurality of memory cells. One memory block may include a plurality of pages. In an embodiment, the page may be a unit for storing data or reading data stored in the memory device 100. The memory block may be a unit for erasing data. In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (SU-RAM), or the like. In this specification, an example in which the memory device 100 is a NAND flash memory is described.

In an embodiment, the memory device 100 may be implemented in a three-dimensional array structure. The present disclosure may be applied to not only a flash memory device in which a charge storage layer is configured with a Floating Gate (FG) but also a Charge Trap Flash (CTF) in which a charge storage layer is configured with an insulating layer.

In an embodiment, each of the memory cells included in the memory device 100 may be configured as a Single Level Cell (SLC) for storing one data bit. In another embodiment, one or more of the memory cells included in the memory device 100 may be configured as a Multi-Level Cell (MLC) for storing two data bits, a Triple Level Cell (TLC) for storing three data bits, or a Quad Level Cell (QLC) for storing four data bits.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

In an embodiment, the memory device 100 includes an operating voltage setting unit 126.

The operating voltage setting unit 126 may set an operating voltage according to an operating voltage information provided from the memory controller 200. The operating voltage may include one or more of a program voltage and an erase voltage. The operating voltage setting unit 126 may set a program voltage based on a time taken to perform an erase operation on one memory block or a plurality of memory blocks, included in the memory device 100. The operating voltage setting unit 126 may set an erase voltage based on a time taken to perform a program operation on memory cells included in one memory block or a plurality of memory blocks, included in the memory device 100.

The memory device 100 may perform a program operation or an erase operation with the set operating voltage under the control of the memory controller 200.

The memory controller 200 may control overall operations of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host 300 and the memory device 100.

In an embodiment, the memory controller 200 may receive data and a Logical Block Address (LBA) from the host 300, and translate the LBA into a Physical Block Address (PBA) representing addresses of memory cells included in the memory device 100, in which data is stored. In an embodiment, the memory controller 200 may further include a buffer memory. Also, the memory controller 200 may store, in the buffer memory, logical-physical address mapping information that establishes a mapping relationship between the LBA and the PBA.

The memory controller 200 may control the memory device 100 to perform a program operation, a read operation, an erase operation, or the like in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a program command, an address, and data without any request from the host 300, and transmit the program command, the address, and the data to the memory device 100. For example, the memory controller 200 may provide the command, the address, and the data to the memory device 100 to perform background operations such as a program operation for wear leveling and a program operation for garbage collection.

In an embodiment, the memory controller 200 may include an operating voltage controller 210. The operating voltage controller 210 may determine an operating voltage for performing a program operation or an erase operation.

The operating voltage controller 210 may calculate an operating time, using information received from the memory device 100 and information generated in the memory controller 200. The operating voltage controller 210 may determine an operating voltage, based on the operating time. The operating time may be a program operating time or an erase operating time.

The program operating time may be a time to complete a program operation to (i) memory cells coupled to a selected word line, (ii) memory cells included in a memory block, or (iii) memory cells included in each of the plurality of memory blocks included in the memory device 100. The erase operating time may be a time to complete an erase operation to each of the plurality of memory blocks included in the memory device 100 or to all of the plurality of memory blocks.

The memory controller 200 may control the memory device 100 so as to set the determined operating voltage.

An operation of the operating voltage controller 210 will be described in more detail with reference to FIGS. 9 to 17.

In an embodiment, the memory controller 200 may control at least two memory devices 100. The memory controller 200 may control the memory devices according to an interleaving scheme so as to improve operational performance.

The host 300 may communicate with the storage device 50 using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
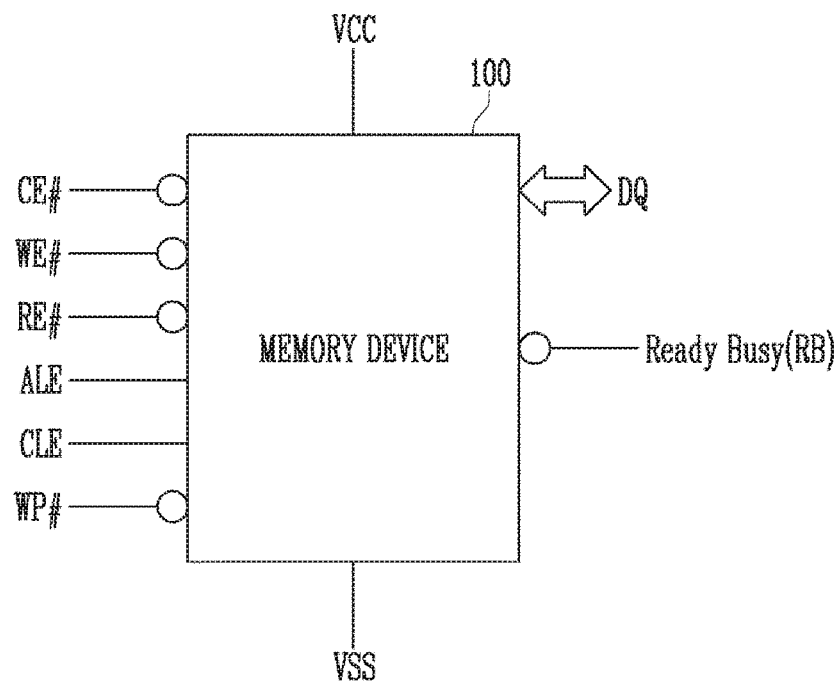
FIG. 2 is a diagram illustrating a configuration of pins of a memory device, such as that of FIG. 1.

FIG. 2 is a diagram illustrating a configuration of pins of the memory device of FIG. 1.

Referring to FIG. 2, the memory device 100 communicates with an external controller through control signal lines including a chip enable line CE #, a write enable line WE #, a read enable line RE #, an address latch enable line ALE, a command latch enable line CLE, a write prevention line WP #, and a ready busy line RB, and data input/output lines DQ.

The memory device 100 may receive a chip enable signal from the external controller through the chip enable line CE #. The memory device 100 may receive a write enable signal from the external controller through the write enable line WE #. The memory device may receive a read enable signal from the external controller through the read enable line RE #. The memory device 100 may receive an address latch enable signal from the external controller through the address latch enable line ALE. The memory device 100 may receive a command latch enable signal from the external controller through the command latch enable line CLE. The memory device 100 may receive a write prevention signal from the external controller through the write prevention line WP #.

In an embodiment, the memory device 100 may output, to the memory controller 200, a ready busy signal for outputting whether the memory device 100 is in a ready state or busy state, through the ready busy line RB.

The chip enable signal may be a control signal for selecting the memory device 100. When the chip enable signal is in a 'high' state, and the memory device 100 corresponds to the 'ready' state, the memory device 100 may enter into a low power standby state.

The write enable signal may be a control signal for controlling a command, an address, and input data, which are input to the memory device 100, to be stored in a latch.

The read enable signal may be a control signal for enabling the output of serial data.

The address latch enable signal may be one of control signals used by a host to represent which one of a command, an address, and data the type of a signal input to the input/output lines DQ is.

The command latch enable signal may be one of control signals used by the host to represent which one of the command, the address, and the data the type of a signal input to the input/output lines DQ is.

For example, when the command latch enable signal is activated (e.g., logic high), the address latch enable signal is inactivated (e.g., logic low), and the write enable signal is activated (e.g., logic low) and then inactivated (e.g., logic high), the memory device may identify that the signal input through the input/output lines DQ is a command.

For example, when the command latch enable signal is inactivated (e.g., logic low), the address latch enable signal is activated (e.g., logic high), and the write enable signal is activated (e.g., logic low) and then inactivated (e.g., logic high), the memory device may identify that the signal input through the input/output lines DQ is an address.

The write prevention signal may be a control signal for inactivating the memory device 100 that performs a program operation and an erase operation.

The ready busy signal may be a signal for identifying a state of the memory device 100. The ready busy signal in a low state represents that the memory device 100 is performing at least one operation. The ready busy signal in a high state represents that the memory device 100 does not perform any operation.

The ready busy signal may be in the low state while the memory device 100 is performing any one of a program operation, a read operation, and the erase operation. In an embodiment of the present disclosure, the memory controller 200 described with reference to FIG. 1 may determine an end time, that is, a time at which a program operation or erase operation is ended, based on the ready busy signal.

Figure 3:
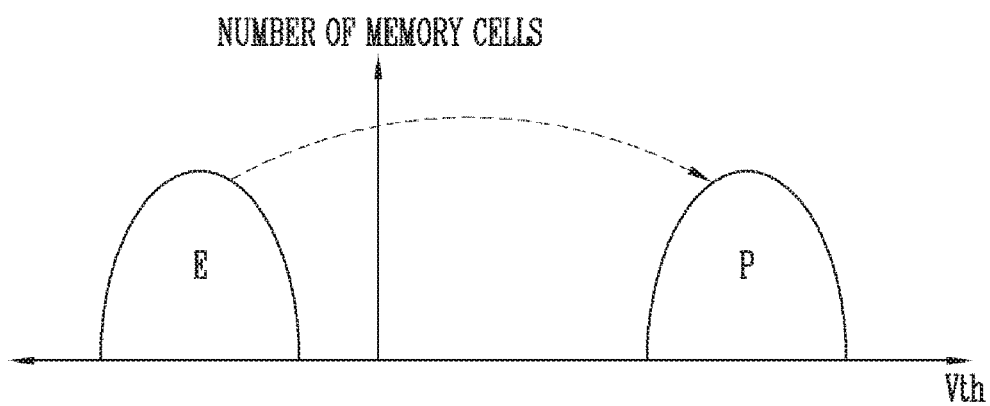
FIG. 3 is a diagram illustrating a change in threshold voltage distribution in a program operation.

FIG. 3 is a diagram illustrating a change in threshold voltage distribution in a program operation.

Referring to FIG. 3, the horizontal axis represents threshold voltage with respect to state of memory cells, and the vertical axis represents number of memory cells.

FIG. 3 is a diagram illustrated based on a Single Level Cells (SLCs) for each storing one data bit. However, the concept illustrated in FIG. 3 may be applied to a Multi-Level Cell (MLC) for storing two data bits, a Triple Level Cell (TLC) for storing three data bits, or a Quad Level Cell (QLC) for storing four data bits.

The memory device 100 may perform a program operation in units of pages. A plurality of memory cells coupled to one word line may constitute one page. The page may be a unit of the program operation.

Memory cells coupled to a selected word line may have a threshold voltage distribution corresponding to an erase state E before the program operation is performed.

Selected memory cells may be programmed to have a threshold voltage distribution corresponding to any one of the erase state E and a program state P according to data to be stored.

The erase state E may correspond to data '1,' and the program state P may correspond to data '0.' The data corresponding to the program state P is merely illustrative. The erase state E may correspond to the data '0', and the program state P may correspond to the data '1.'

Figure 4:
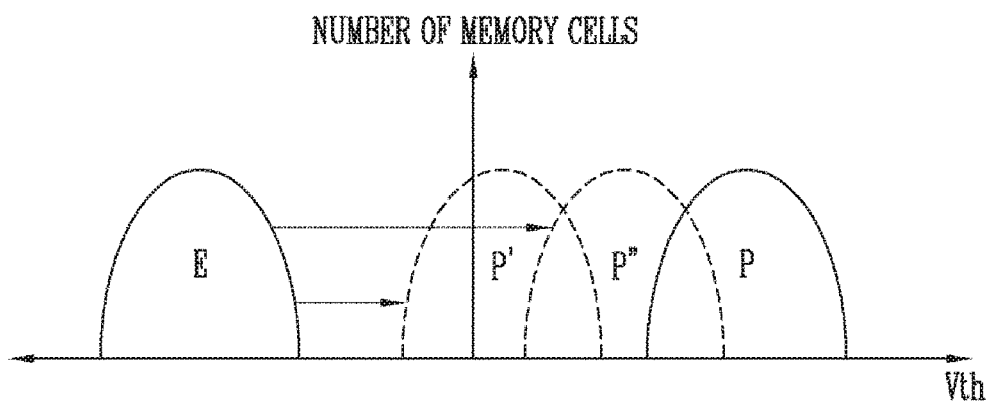
FIG. 4 is a diagram illustrating a difference in program speed with respect to quantity of charges trapped in tunnel oxides of memory cells in the program operation.

FIG. 4 is a diagram illustrating a difference in program speed with respect to quantity of charges trapped in tunnel oxides of memory cells in the program operation.

Referring to FIG. 4, the horizontal axis represents threshold voltage with respect to state of memory cells, and the vertical axis represents number of memory cells.

A quantity of charges trapped in a tunnel oxide (TOX) of each of memory cells may be changed depending on environment (temperature, humidity, etc.). A program operating time may be changed depending on the quantity of charged trapped in the TOX.

In the program operation, charges trapped in the TOX may be moved to a Charge Trap Layer (CTL). Therefore, the program operating time may be changed depending on the quantity of charges trapped in the TOX. When the quantity of charges trapped in the TOX decreases, the program operating time may be lengthened. When the quantity of charges trapped in the TOX increases, the program operating time may be shortened.

Referring to FIG. 4, when the program operation is performed, memory cells having the program state P as a target state, among memory cells in a selected word line, are programmed from the erase state E to the program state R The program operation may be performed by repeating a plurality of program loops. FIG. 4 illustrates change in threshold voltage distribution with respect to quantity of charges trapped in TOXs of the memory cells when some of the plurality of program loops are performed.

While the program loops are being performed, the threshold voltage distribution may be changed depending on a quantity of charges trapped in the TOX. When the same program voltage is applied, the threshold voltage of a memory cell may be less increased when the quantity of charges trapped in the TOX decreases. Alternatively, the threshold voltage of a memory cell may be more rapidly increased when the quantity of charges trapped in the TOX increases. Therefore, when the same program voltage is applied, memory cells each having a small quantity of charges trapped in the TOX may have a threshold voltage distribution corresponding to P'. In addition, when the same program voltage is applied, memory cells each having a large quantity of charges trapped in the TOX may have a threshold voltage distribution corresponding to P'''.

As described above, since a program speed depends on a quantity of charges trapped in the TOX of each of the memory cells, the width of a threshold voltage distribution may vary even with the same program voltage applied when the quantity of charges trapped in the TOX varies. Accordingly, it is necessary to perform the program operation, using an appropriate program voltage, depending on a quantity of charges trapped in the TOX of each of the memory cells.

The quantity of charges trapped in the TOX of each of the memory cells may be determined based on a time taken to perform an erase operation. In an embodiment of the present disclosure, the magnitude of a program voltage may be determined based on a time taken to perform the erase operation on corresponding memory cells.

A method of determining a program voltage according to an erase operating time will be described in more detail with reference to FIG. 8.

Figure 5:
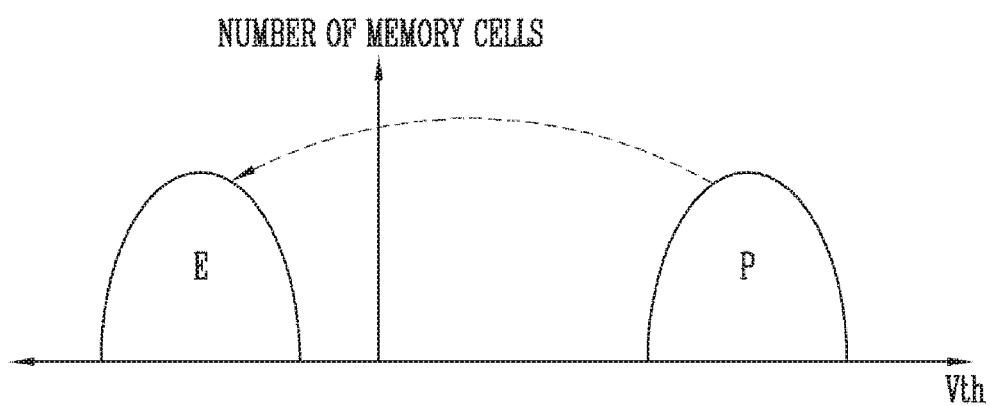
FIG. 5 is a diagram illustrating a change in threshold voltage distribution in an erase operation.

FIG. 5 is a diagram illustrating a change in threshold voltage distribution in an erase operation.

Referring to FIG. 5, the horizontal axis represents threshold voltage with respect to state of memory cells, and the vertical axis represents number of memory cells.

FIG. 5 is a diagram illustrated based on a Single Level Cells (SLCs) for each storing one data bit. However, the concept illustrated in FIG. 5 may be applied to a Multi-Level Cell (MLC) for storing two data bits, a Triple Level Cell (TLC) for storing three data bits, or a Quad Level Cell (QLC) for storing four data bits.

The memory device 100 may perform an erase operation in units of memory blocks. A plurality of word lines may be coupled to a memory block. Memory cells respectively coupled to the plurality of word lines may be erased in units of memory blocks.

Memory cells having a threshold voltage corresponding to a program state P, among the memory cells included in the memory block, may have a threshold voltage distribution corresponding to an erase state E when the erase operation is performed.

The erase state E may correspond to data '1,' and the program state P may correspond to data '0.' The data corresponding to the program state P is merely illustrative. The erase state E may correspond to the data '0', and the program state P may correspond to the data '1.'

Figure 6:
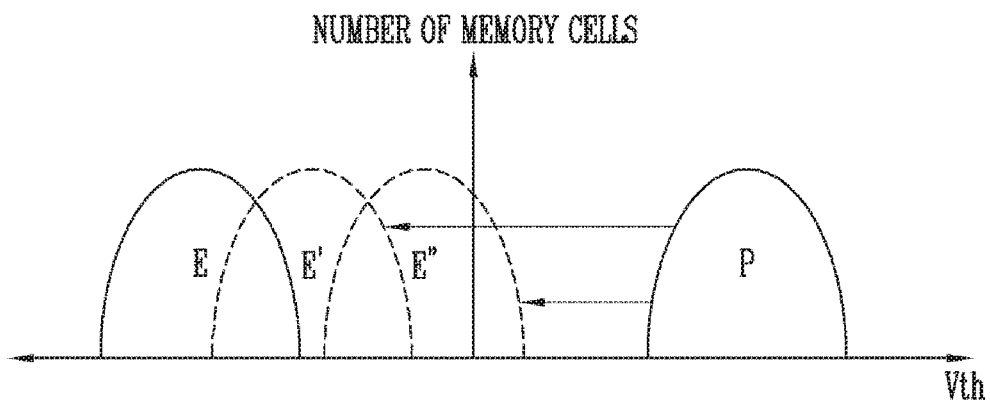
FIG. 6 is a diagram illustrating a difference in program speed with respect to quantity of charges trapped in tunnel oxides of memory cells in the erase operation.

FIG. 6 is a diagram illustrating a difference in program speed with respect to quantity of charges trapped in tunnel oxides of memory cells in the erase operation.

Referring to FIG. 6, the horizontal axis represents threshold voltage with respect to state of memory cells, and the vertical axis represents number of memory cells.

A quantity of charges trapped in a tunnel oxide (TOX) of each of memory cells may be changed depending on environment (temperature, humidity, etc.). An erase operating time may be changed depending on the quantity of charged trapped in the TOX.

In the erase operation, charges trapped in the TOX may be moved to a channel of a memory cell. Therefore, the erase operating time may be changed depending on the quantity of charges trapped in the TOX. When the quantity of charges trapped in the TOX decreases, the erase operating time may be shortened. When the quantity of charges trapped in the TOX increases, the erase operating time may be lengthened.

Referring to FIG. 6, when the erase operation is performed, memory cells having a threshold voltage corresponding to the program state P, among memory cells included in a memory block, may have a threshold voltage distribution of the erase state E. The erase operation may be performed by repeating a plurality of erase loops. FIG. 6 illustrates change in threshold voltage distribution with respect to quantity of charges trapped in TOXs of the memory cells when some of the plurality of erase loops are performed.

While the erase loops are being performed, the threshold voltage distribution may be changed depending on a quantity of charges trapped in the TOX. When the same erase voltage is applied, a relatively large quantity of charges is moved to a channel region instead of a CTL when the quantity of charges trapped in the TOX decreases. Hence, the threshold voltage of a memory cell may be more rapidly decreased. Alternatively, the threshold voltage of a memory cell may be less decreased when the quantity of charges trapped in the TOX increases. Therefore, when the same erase voltage is applied, memory cells each having a small quantity of charges trapped in the TOX may have a threshold voltage distribution corresponding to E'. In addition, when the same erase voltage is applied, memory cells each having a large quantity of charges trapped in the TOX may have a threshold voltage distribution corresponding to E".

As described above, since an erase speed depends on a quantity of charges trapped in the TOX of each of the memory cells, the width of a threshold voltage distribution may vary even with the same erase voltage applied when the quantity of charges trapped in the TOX varies. Accordingly, it is necessary to perform the erase operation, using an appropriate erase voltage, depending on a quantity of charges trapped in the TOX of each of the memory cells.

The quantity of charges trapped in the TOX of each of the memory cells may be determined based on a time taken to perform a program operation. In an embodiment of the present disclosure, the magnitude of an erase voltage may be determined based on a time taken to perform the program operation on corresponding memory cells.

A method of determining an erase voltage according to a program operating time will be described in more detail with reference to FIG. 7.

Figure 7:
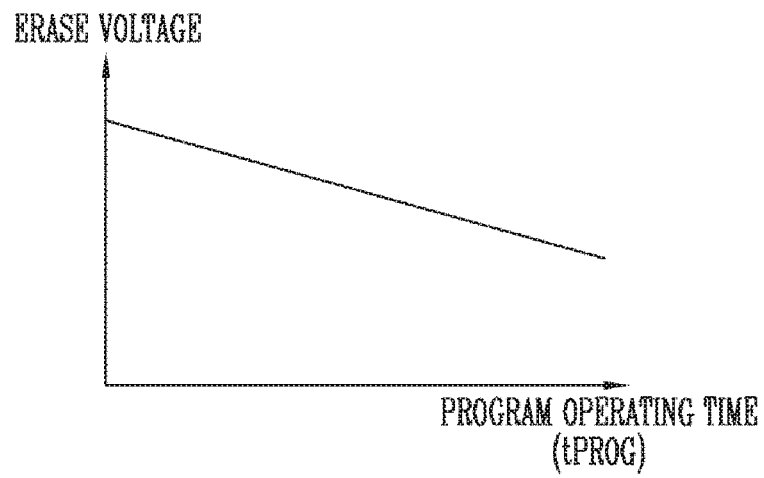
FIG. 7 is a graph illustrating a relationship between a program operating time and an erase voltage to be applied in the erase operation.

FIG. 7 is a graph illustrating a relationship between a program operating time and an erase voltage to be applied in the erase operation.

Referring to FIG. 7, the horizontal axis represents program operating time tPROG, and the vertical axis represents erase voltage Erase Voltage. The program operating time tPROG represents a time taken to perform the program operation on memory cells included in a memory block. The erase voltage Erase Voltage represents a voltage used to perform the erase operation on memory cells included in a memory block.

When the quantity of charges trapped in the TOX of each of the memory cells decreases, the program operating time tPROG may be lengthened, and the erase operating time may be shortened. When the quantity of charges trapped in the TOX of each of the memory cells increases, the program operating time tPROG may be shortened, and the erase operating time may be lengthened.

Therefore, when the time taken to program specific memory cells is short, the memory device 100 may control the speed of the erase operation by applying a relatively high erase voltage Erase Voltage to a selected word line.

On the contrary, when the program operating time tPROG is lengthened, the quantity of charges trapped in the TOX is small, and hence the erase operating time may be shortened. Therefore, in the erase operation, the memory device 100 may perform the erase operation by applying a relatively low erase voltage Erase Voltage.

The erase voltage Erase Voltage is determined according to the program operating time tPROG, so that the reliability of the memory device 100 can be improved.

Figure 8:
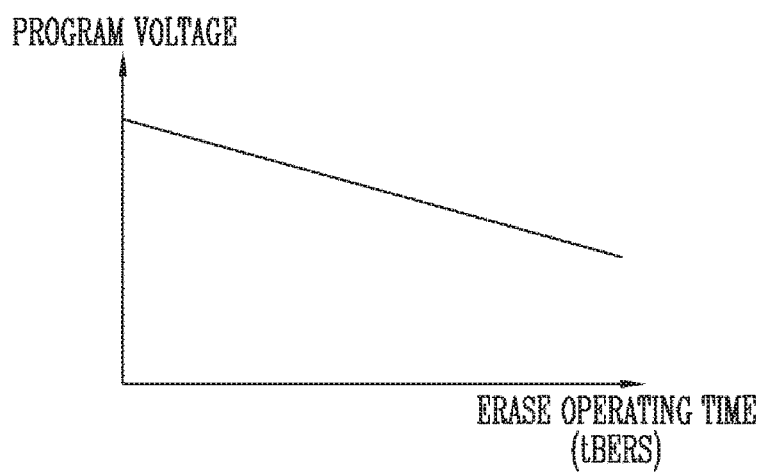
FIG. 8 is a graph illustrating a relationship between an erase operating time and a program voltage to be applied in the program operation.

FIG. 8 is a graph illustrating a relationship between an erase operating time and a program voltage to be applied in the program operation.

Referring to FIG. 8, the horizontal axis represents erase operating time tBERS, and the vertical axis represents program voltage Program Voltage. The erase operating time tBERS represents a time taken to perform the erase operation on memory cells included in a memory block. The program voltage Program Voltage represents a voltage used to perform the program operation on memory cells included in a memory block.

When the quantity of charges trapped in the TOX of each of the memory cells decreases, the erase operating time tBERS may be shorted, and the program operating time may be lengthened. When the quantity of charges trapped in the TOX of each of the memory cells increases, the erase operating time tBERS may be lengthened, and the program operating time may be shortened.

Therefore, when the time taken to erase specific memory cells is short, the memory device 100 may control the speed of the program operation by applying a relatively high program voltage Program Voltage to a selected word line.

On the contrary, when the erase operating time tBERS is lengthened, the quantity of charges trapped in the TOX is large, and hence the program operating time may be shortened. Therefore, in the program operation, the memory device 100 may perform the program operation by applying a relatively low program voltage Program Voltage.

The program voltage Program Voltage is determined according to the erase operating time tBERS, so that the reliability of the memory device 100 can be improved.

Figure 9:
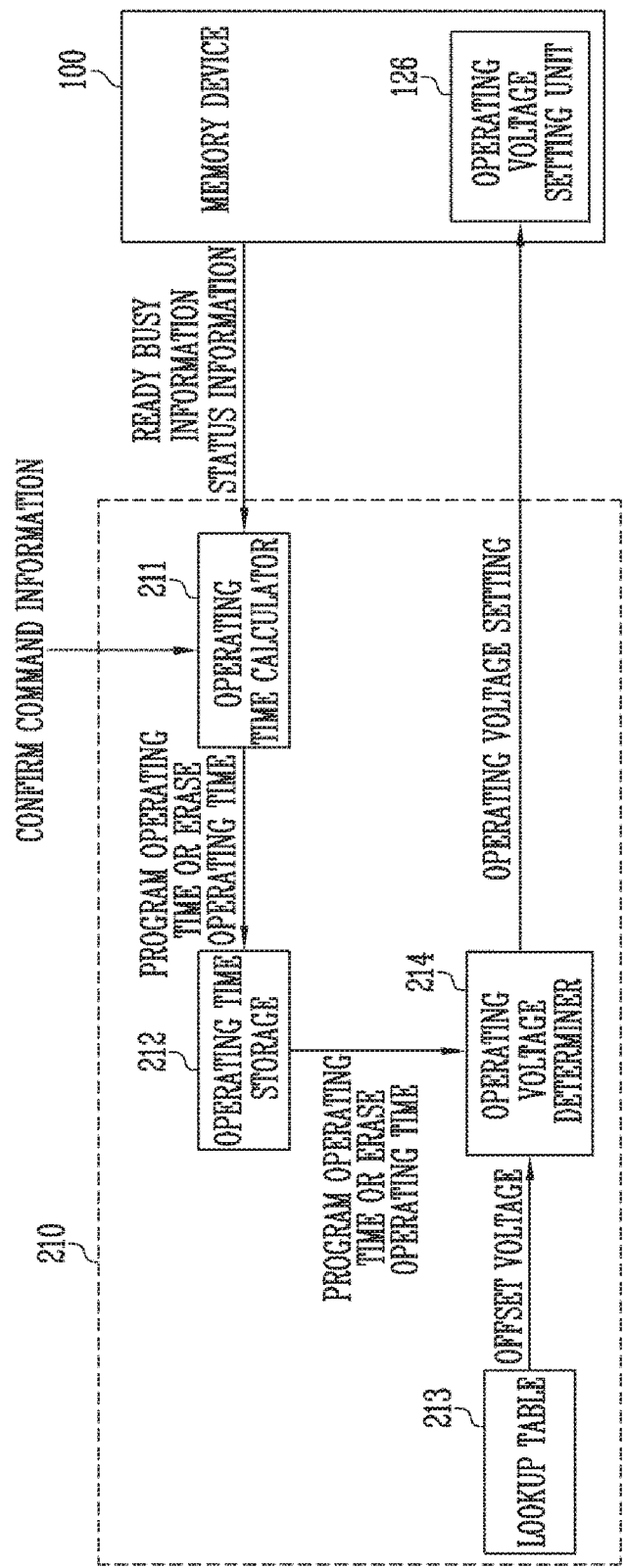
FIG. 9 is a diagram illustrating a structure of an operating voltage controller, such as that of FIG. 1.

FIG. 9 is a diagram illustrating a structure of the operating voltage controller of FIG. 1.

Referring to FIG. 9, the operating voltage controller 210 may include an operating time calculator 211, an operating time storage 212, a lookup table 213, and an operating voltage determiner 214.

The operating time calculator 211 may calculate a time taken to perform an operation. The operating time calculator 211 may receive confirm command information, ready busy information, and status information. The operating time calculator 211 may calculate a time taken to perform an operation, using the received information. The confirm command information may be acquired in the memory controller 200, and the ready busy information and the status information may be acquired from the memory device 100.

The confirm command information may include information on a time at which a confirm command is provided from the memory controller 200 to the memory device 100. The confirm command may be a command indicating that the memory device 100 is to perform an operation. The operating time calculator 211 may determine a start time of the operation according to the confirm command information. For example, in a program operation, a time at which a program confirm command is provided from the memory controller 200 to the memory device 100 may be a start time of the program operation. Alternatively, in an erase operation, a time at which erase confirm command is provided from the memory controller 200 to the memory device 100 may be a start time of the erase operation.

The read busy information may be information on a ready busy signal provided by the memory device 100. The ready busy signal indicates whether the state of the memory device 100 is a ready state or busy state. The ready state is a state in which the memory device 100 has completed an operation and is ready to receive a command for a next operation. The busy state may be a state in which the memory device 100 is performing the operation. The operating time calculator 211 may determine an end time of the operation according to the ready busy information. Specifically, the operating time calculator 211 may determine a time at which the ready busy signal is changed from the busy state to the ready state as the end time of the operation. For example, in the program operation, a time at which the ready busy signal is changed from the busy state to the ready state may be an end time of the program operation. Alternatively, in the erase operation, a time at which the ready busy signal is changed from the busy state to the ready state may be an end time of the erase operation.

The operating time calculator 211 may calculate, as an operating time, the time from the start time to the end time of the operation. That is, the operating time may be an actual operating time taken for the memory device 100 to complete each operation by receiving a program command or erase command from the memory controller 200.

In an embodiment, a program operating time may be a time taken to complete a program operation to (i) memory cells coupled to a selected word line, (ii) a plurality of memory cells included in a memory block, or (iii) memory cells included in each of the plurality of memory blocks included in the memory device 100. An erase operating time may be a time taken to complete an erase operation to each of the plurality of memory blocks included in the memory device 100 or to all of the plurality of memory blocks.

Specifically, the operating time calculator 211 may calculate, as an operating time, the time from the start time of the operating time determined according to the confirm command information to the end time of the operating time determined according to the ready busy information. Specifically, the program operating time may be from when the program confirm command is provided to when the ready busy signal is changed from the busy state to the ready state. In another embodiment, the erase operating time may be from when the erase confirm command is provided to when the ready busy signal is changed from the busy state to the ready state.

In various embodiments, the end time of the operating time may be determined using the status information.

When a set time elapses after a command for the program operation or the erase operation is provided to the memory device 100, the memory controller 200 may provide a status read command to the memory device 100. The status read command may be a command for requesting data stored in a status register included in the memory device 100.

The status information may include ready information and fail information. The fail information may be information representing whether the program operation or the erase operation has passed or failed. The operating time calculator 211 may determine whether an operating time is to be measured based on the fail information. For example, when the program operation or the erase operation fails, the operating time calculator 211 may not measure the operating time. Alternatively, when the program operation or the erase operation passes, the operating time calculator 211 may measure the operating time.

The ready information may represent whether the state of the memory device 100 corresponds to any one of the ready state or busy state. In an embodiment, the ready information may be set according to the ready busy signal.

The operating time calculator 211 may determine an end time of the operating time, based on the ready information included in the status information. Specifically, the end time of the program operation may be a time at which the operating time calculator 211 receives the status information including the ready information indicating the ready state from the memory device 100 in the program operation. Alternatively, the end time of the erase operation may be a time at which the operating time calculator 211 receives the status information including the ready information indicating the ready state from the memory device 100 in the erase operation.

The operating time calculator 211 may calculate, as the operating time, the time from the start time of the operating time, which is determined according to the confirm command information, to the end time of the operating time, which is determined according to the ready information included in the status information. Specifically, the program operating time may be from when the program confirm command is provided to when the ready information representing that the state of the memory device 100 is the ready state is input. In another embodiment, the erase operating time may be from when the erase confirm command is provided to when the ready information, representing that the state of the memory device 100 is the ready state, is input.

The operating time storage 212 may store an operating time calculated by the operating time calculator 211. The operating time may include a program operating time or the erase operating time.

The operating time storage 212 may store a program operating time for each memory block included in the memory device 100. Specifically, the operating time storage 212 may store, for each word line, program operating times on a plurality of pages included in a memory block. For example, the operating time storage 212 may store, as a program operating time reference value tREF, a program operating time for memory cells coupled to a word line that are first programmed, among the memory cells included in the memory block. Subsequently, the operating time storage 212 may store, for each word line, program operating times for memory cells coupled to the other word lines.

The operating time storage 212 may store a time at which the program operation is performed on each of the plurality memory blocks included in the memory device 100. Specifically, the operating time storage 212 may store, as an operating time, a time taken to program memory cells included in any one of the plurality of memory blocks or store, as an operating time, a time taken to program a plurality of memory cells included in the plurality of memory blocks.

The operating time storage 212 may store a program operating time for memory cells in a memory block of which program operation is completed first, among the plurality of memory blocks in the memory device 100, as a program operating time reference value tREF of the memory block. The program operating time reference value tREF may be a reference operating time. The operating time storage 212 may store program operating times for memory cells included in each of the other memory blocks. In an embodiment, the operating time storage 212 may store difference values between the program operating times for the other memory blocks and the program operating time reference value tREF.

In another embodiment, the operating time storage 212 may set, as a program operating time reference value tREF, a time taken to program a plurality of memory cells included in the memory device 100. The program operating time reference value tREF may be a reference operating time. Subsequently, the operating time storage 212 may store a difference value between the time taken to program the memory cells included in the memory device 100 and the program operating time reference value tREF. The time taken to perform the program operation on the memory device 100 after the program operating time reference value tREF is determined may be a comparison operating time. The comparison operating time may be determined after the program operation is performed a most recent time, i.e., after the program operation is lastly performed, on the memory device 100.

The operating time storage 212 may store an erase operating time for each memory block included in the memory device 100. The operating time storage 212 may store, as erase operating time reference values, operating times of the first-performed erase operations on the respective memory blocks in the memory device 100. Subsequently, when the erase operation on the plurality of memory blocks included in the memory device 100 is performed, the operating time storage 212 may store, for each memory block, difference values between times taken to perform the erase operation on the respective memory blocks and the erase operating time reference values. The operating time storage 212 may store, for each memory block, difference values between times taken to perform the erase operation a most recent time, i.e., to lastly perform the erase operation, on the respective memory blocks included in the memory device 100 and the erase operating time reference values. The times taken to lastly perform the erase operation on the respective memory blocks may be comparison operating times. The comparison operating time may be determined after the erase operation is lastly performed on each of the plurality of memory blocks.

In another embodiment, the operating time storage 212 may store, as an erase operating time reference value, a time taken to erase all of the plurality of memory blocks included in the memory device 100. The erase operating time reference value may be a reference operating time. Subsequently, the operating time storage 212 may store a difference value between the time taken to erase all of the plurality of memory blocks included in the memory device 100 and the erase operating time reference value. After the erase operating time reference value is determined, the time taken to erase all of the plurality of memory blocks included in the memory device 100 may be a comparison operating time. The comparison operating time may be determined after the erase operation is lastly performed on the memory device 100. The comparison operating time may be a time taken to lastly perform the erase operation on the memory device 100.

The operating time storage 212 may provide the stored operating time to the operating voltage determiner 214.

The operating voltage determiner 214 may determine an operating voltage with which the memory device 100 is to perform an operation. The operating voltage determiner 214 may control the memory device 100 to perform the operation with the determined operating voltage.

The operating voltage determiner 214 may determine a program voltage to be used in the program operation, based on the erase operating time. Specifically, the operating voltage determiner 214 may determine a program voltage for memory cells included in each memory block according to the magnitude of a difference value of an erase operating time of the corresponding memory block. The operating voltage determiner 214 may determine a program voltage for memory cells included in the memory device 100 according to the magnitude of a difference value of an erase operating time of the memory device 100. In an embodiment, the operating voltage determiner 214 may determine an offset voltage to be reflected to a set default program voltage.

When the difference value of the erase operating time of the memory block is less than 0, the erase operating time of the corresponding block is less than a reference value. This may be a case where an erase speed is faster than the erase operating time at which the erase operation is firstly performed.

When a difference value of an erase operating time of a memory block is greater than 0, the erase operating time of the corresponding block is greater than the reference value. This may be a case where the erase speed is slower than the erase operating time at which the erase operation is firstly performed.

When a difference value of an erase operating time is less than 0, the operating voltage determiner 214 may determine, as the program voltage, a value obtained by adding the offset voltage to the set default program voltage. When the difference value of the erase operating time is greater than 0, the operating voltage determiner 214 may determine, as the program voltage, a value obtained by subtracting the offset voltage from the set default program voltage.

The operating voltage determiner 214 may determine an erase voltage used in the erase operation, based on the program operating time. Specifically, the operating voltage determiner 214 may determine an erase voltage according to a program operating time representative value tREP of memory cells included in a memory block. The operating voltage determiner 214 may determine an erase voltage for memory blocks included in the memory device 100 according to a program operating time for memory cells included in the memory device 100.

In an embodiment, the program operating time representative value tREP of the memory cells included in the memory block may be an average value of program operating times of memory cells, except memory cells coupled to a word line, which are programmed first, among the memory cells included in the corresponding memory block.

In another embodiment, the program operating time representative value tREP may be determined after the program operation is lastly performed on the corresponding memory block. The time determined after the program operation is lastly performed may be a comparison operating time. For example, the comparison operating time may be the program operating time representative value tREP of the memory cells in the memory block.

For example, the program operating time representative value tREP may be a value obtained by dividing a number of word lines to which memory cells are coupled into the total sum of program operating times of memory cells, except the first-programmed memory cells coupled to the word line, among the memory cells in the corresponding memory block.

The operating voltage determiner 214 may determine an erase voltage, based on the difference between the program operating time reference value tREF and the program operating time representative value tREP. Specifically, the operating voltage determiner 214 may determine an erase voltage, based on the difference between the program operating time reference value tREF and the time taken to lastly perform the program operation on the corresponding memory block. For example, the operating voltage determiner 214 may determine an erase voltage, based on the difference between the program operating time reference value tREF and the program operating time representative value tREP of the memory cells in the memory block.

The operating voltage determiner 214 may determine an offset voltage to be reflected to a set default erase voltage.

When a difference value of a program operating time of memory cells included in a memory block for each word line is less than 0, the program operating time of the corresponding block is shorter than a reference value. This may be a case where a program speed is faster than the program operating time at which the program operation is firstly performed.

When a difference value of a program operating time of memory cells included in a memory block for each word line is greater than 0, the program operating time of the corresponding block is longer than the reference value. This may be a case where the program speed is slower than the program operating time at which the program operation is firstly performed.

When a difference value of a program operating time is less than 0, the operating voltage determiner 214 may determine, as the erase voltage, a value obtained by adding the offset voltage to the set default erase voltage. When the difference value of the program operating time is greater than 0, the operating voltage determiner 214 may determine, as the erase voltage, a value obtained by subtracting the offset voltage from the set default erase voltage.

The lookup table 213 may include an offset voltage according to a difference value of the program operating time. The difference value of the program operating time may be determined according to the difference between the program operating time representative value tREP and the program operating time reference value tREF. The difference value of the program operating time may belong to any one section among a plurality of sections included in the lookup table 213. An offset voltage reflected to the set default erase voltage may be determined according to the difference value of the program operating time.

The lookup table 213 may include an offset voltage according to a difference value of the erase operating time. The difference value of the erase operating time may be determined according to the difference between an erase operating time of a corresponding memory block and the erase operating time reference value. The difference value of the erase operating time may belong to any one section among the plurality of sections included in the lookup table 213. An offset value reflected to the set default program voltage may be determined according to the difference value of the erase operating time.

In an embodiment, an offset voltage determined in the lookup table 213 may be provided to the operating voltage determiner 214 according to a difference value of an operating time.

FIG. 10 is a diagram illustrating a program operating time stored in the operating time storage 212 of FIG. 9.

Referring to FIG. 10, the operating time storage 212 may store a program operating time tPROG provided from the operating time calculator 211. In a program operation, the program operating time tPROG may be a calculated time from a start time of the program operation to an end time of the program operation.

In a first memory block BLK1, a program operating time tPROG of first-programmed memory cells coupled to a first word line WL1 may be stored as a program operating time reference value tREF. The program operating time reference value tREF may be a reference for determining whether the program speed of the corresponding memory block is faster or slower. The program operating time reference value tREF may be used to determine an erase voltage of the first memory block BLK1.

In the first memory block BLK1, program operating times t12 to tin of memory cells coupled to the other word lines WL2 to WLn may be stored for each word line. The program operating time stored for each word line may be greater or less than the program operating time reference time tREF. For example, when a program operating time tPROG of memory cells coupled to a specific word line is greater than the program operating time reference value tREF, the program speed of the memory cells coupled to the corresponding word line may be slower. When the program operating time tPROG of the memory cells coupled to the specific word line is less than the program operating time reference value tREF, the program speed of the memory cells coupled to the corresponding word line may be faster. The program operating time tPROG stored for each word line may be used to determine an erase voltage of the first memory block BLK1.

FIG. 10 exemplarily illustrates a program operating time tPROG of the plurality of word lines WL1 to WLn coupled to the first memory block BLK1 and zth memory block BLKz among a plurality of memory blocks BLK1 to BLKz. This may be applied to second to zth memory blocks BLK2 to BLKz.

FIG. 11 is a diagram illustrating an erase operating time stored in the operating time storage 212 of FIG. 9.

Referring to FIG. 11, the operating time storage 212 may store an erase operating time tBERS provided from the operating time calculator 211. The operating time storage 212 may store difference values ΔtBERS of the erase operating time for each memory block.

In an erase operation, the erase operating time tBERS may be a calculated time from a start time of the erase operation to an end time of the erase operation. In FIG. 11, tBERS1 to tBERSz represent stored operating times at which the erase operations are first performed on the respective memory blocks BLK1 to BLKz. Such erase operating times may be erase operating time reference values.

Difference values ΔtBERS1 to ΔtBERSz of the erase operating times may be stored for the respective memory blocks. The difference values ΔtBERS1 to ΔtBERSz of the erase operating times may be difference values between the erase operating times at which the erase operation is performed on the respective memory blocks and erase operating time reference values tBERS1 to tBERSz of the respective memory blocks.

When each of the difference values ΔtBERS1 to ΔtBERSz of the erase operating times is less than 0, the erase operating time of the corresponding block is shorter than the reference value. This may be a case where an erase speed is faster than the erase operating time at which the erase operation is firstly performed When each of the difference values ΔtBERS1 to tBERSz of the erase operating times is greater than 0, the erase operating time of the corresponding block is longer than the reference value. This may be a case where the erase speed is slower than the erase operating time at which the erase operation is firstly performed.

Each time the erase operation on the memory blocks is performed, the difference values ΔtBERS1 to ΔtBERSz of the erase operating times may be updated and the updated difference values may be stored.

Each of the difference values ΔtBERS1 to ΔtBERSz of the erase operating times may be used to determine a program voltage of a corresponding memory block.

FIG. 12 is a diagram illustrating an offset voltage of a program voltage stored in the lookup table of FIG. 9.

Referring to FIG. 12, the difference value ΔtBERS of the erase operating time may correspond to any one value among ΔtBERS1 to ΔtBERSz of FIG. 11. The difference value ΔtBERS of the erase operating time may belong to any one section among a plurality of sections. Values (x1, x2, x3, and the like) of a range belonging to the difference value ΔtBERS of the erase operating time may correspond to any one of positive and negative values. An offset voltage Offset to be reflected to the set default program voltage may be determined according to the range belonging to the difference value ΔtBERS of the erase operating time.

In an embodiment, when the difference value ΔtBERS of the erase operating time is less than 0, the program voltage may be determined as a value obtained by adding the offset voltage Offset to the set default program voltage. For example, when the difference value ΔtBERS of the erase operating time is less than 0, and the range belonging to the difference value corresponds to a first section (i.e., ΔtBERS<x1), the program voltage may be determined as a value obtained by adding an offset voltage Vpgm1 to the set default program voltage.

In another embodiment, when the difference value ΔtBERS of the erase operating time is greater than 0, the program voltage may be determined as a value obtained by subtracting the offset voltage Offset from the set default program voltage. For example, when the difference value ΔtBERS of the erase operating time is greater than 0, and the range belonging to the difference value corresponds to the first section (ΔtBERS<x1), the program voltage may be determined as a value obtained by subtracting the offset voltage Vpgm1 from the set default program voltage.

FIG. 13 is a diagram illustrating an offset voltage of an erase voltage stored in the lookup table of FIG. 9.

Referring to FIG. 13, the difference value between a program operating time representative value tREP and a program operating time reference value tREF (i.e., tREP-tREF) may belong to any one section among a plurality of sections.

The program operating time representative value tREP may correspond to an average value of program operating times of memory cells coupled to the other word lines, except a word line to which first-programmed memory cells in a memory block are coupled. The program operating time reference value tREF may correspond to a program operating time of first-programmed memory cells coupled to a word line, among memory cells in a memory block.

Values (y1, y2, y3, and the like) of a range belonging to the difference value (tREP-tREF) of the program operating time may correspond to any one of positive and negative values. An offset voltage Offset reflected to the set default erase voltage may be determined according to the range belonging to the difference value of the program operating time.

In an embodiment, when the different value (tREP-tREF) of the program operating time is less than 0, the erase voltage may be determined as a value obtained by adding the offset voltage Offset to the present default erase voltage. For example, when the difference value (tREP-tREF) of the program operating time is less than 0, and the range belonging to the difference value corresponds to a first section (tREP-tREF<y1), the erase voltage may be determined as a value obtained by adding an offset voltage Vers1 to the set default erase voltage.

In another embodiment, when the different value (tREP-tREF) of the program operating time is greater than 0, the erase voltage may be determined as a value obtained by subtracting the offset voltage Offset from the set default erase voltage. For example, when the difference value (tREP-tREF) of the program operating time is greater than 0, and the range belonging to the difference value corresponds to the first section (tREP-tREF<y1), the erase voltage may be determined as a value obtained by subtracting the offset voltage Vers1 from the set default erase voltage.

FIG. 14 is a diagram illustrating a method for measuring a program operating time of memory cells.

Referring to FIG. 14, the memory controller 200 may provide commands CMD1 and CMD2, an address ADDR, and data DATA to the memory device 100 through the input/output lines. The memory device 100 may provide a ready busy signal to the memory controller 200 through the ready busy line RB.

In an embodiment, the command may include commands for performing a program operation. The commands may include a setup command CMD1 and a confirm command CMD2. A command to be serviced by the memory device 100 may be determined according to the setup command CMD1. The confirm command CMD2 may be a command for instructing an operation of the memory device 100. A program command may be determined by the setup command CMD1, and the memory device 100 may perform the program operation in response to the confirm command CMD2. The memory controller 200 may output the setup command CMD1 and then provide the memory device 100 with an address ADDR for the command determined by the setup command CMD1.

The address ADDR means an area in which the setup command CMD1 is to be serviced. The address ADDR may be configured with a row address and a column address. The memory device 100 may access a selected area according to the address ADDR.

In an embodiment, the memory controller 200 may output an address and then provide data DATA to the memory device 100. In the program operation, the memory device 100 may program the data DATA in the selected area according to the address.

In an embodiment, the memory controller 200 may output data to the memory device 100 and then output the confirm command CMD2. The confirm command CMD2 may be a command for instructing the memory device 100 to perform an operation. The memory controller 200 may provide the confirm command CMD2 to the memory device 100. Referring to FIG. 9, information on a time t1 at which the confirm command CMD2 is provided from the memory controller 200 to the memory device 100 may be included in confirm command information. The operating time calculator 211 described with reference to FIG. 9 may determine a start time of the program operation according to the confirm command information.

The ready busy signal is provided from the memory device 100 to the memory controller 200 through the ready busy line RB. Ready busy information may be information on the ready busy signal. The ready busy signal indicates whether the state of the memory device 100 is a ready state or busy state. When the ready busy signal has a low state, this represents that the state of the memory device 100 is the busy state. When the ready busy signal has a high state, this represents that the state of the memory device 100 is the ready state. The memory controller 200 may determine a time t2 at which the ready busy signal is changed from the busy state to the ready state as an end time of the program operation.

The memory device 100 may perform the program operation during a program operating time tPROG.

FIG. 15 is a diagram illustrating a method for measuring or determining an erase operating time of a memory block.

Referring to FIG. 15, the memory controller 200 may provide commands CMD3 and CMD4 and an address ADDR to the memory device 100 through the input/output lines. The memory device 100 may provide a ready busy signal to the memory controller 200 through the ready busy line RB.

In an embodiment, the command may include commands for performing an erase operation. The commands may include a setup command CMD3 and a confirm command CMD4. A command to be serviced by the memory device 100 may be determined according to the setup command CMD3. The confirm command CMD4 may be a command for instructing the memory device 100 to perform an operation. An erase command may be determined by the setup command CMD3, and the memory device 100 may perform an erase operation in response to the confirm command CMD4. The memory controller 200 may output the setup command CMD3 and then provide the memory device 100 with an address ADDR for the command determined by the setup command CMD3.

The address ADDR means an area in which the setup command CMD3 is to be serviced. The address ADDR may be configured with a row address and a column address. The memory device 100 may access a selected area according to the address ADDR.

In an embodiment, the memory controller 200 may output the address ADDR to the memory device 100 and then output the confirm command CMD4. The confirm command CMD4 may be a command for instructing the memory device 100 to perform an operation. The memory controller 200 may output the confirm command to the memory device 100 so as to confirm a command to be performed by the memory device 100. Referring to FIG. 9, information on a time t3 at which the confirm command CMD4 is provided from the memory controller 200 to the memory device 100 may be included in confirm command information. The operating time calculator 211 described with reference to FIG. 9 may determine a start time of the erase operation according to the confirm command information.

The ready busy signal is provided from the memory device 100 to the memory controller 200 through the ready busy line RB. Ready busy information may be information on the ready busy signal. The ready busy signal indicates whether the state of the memory device 100 is a ready state or busy state. When the ready busy signal has a low state, this represents that the state of the memory device 100 is the busy state. When the ready busy signal has a high state, this represents that the state of the memory device 100 is the ready state. The memory controller 200 may determine a time t4 at which the ready busy signal is changed from the busy state to the ready state as an end time of the program operation.

The memory device 100 may perform the erase operation during an erase operating time tBERS.

Figure 16:
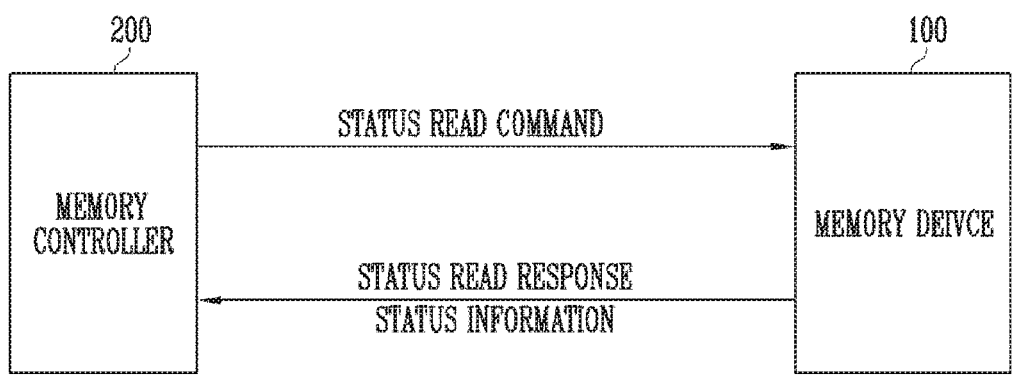
FIG. 16 is a diagram illustrating a method for acquiring, by a memory controller, status information.

FIG. 16 is a diagram illustrating a method for acquiring, by the memory controller, status information.

Referring to FIG. 16, the memory controller 200 may provide status read command to the memory device 100. The memory controller 200 may request the memory device 100 of information related to a state of the memory device 100 according to the status read command. The memory device 100 may provide a status read response to the memory controller 200 according to the status read command. The status read response may include status information on the state of the memory device 100. The status information may include ready information and fail information. The ready information and the fail information, which are included in the status information, will be described in more detail with reference to FIG. 17.

In an embodiment, the status read response may include status information. The status information may include information on whether an operation performed by the memory device 100 has passed or failed. In another embodiment, the status information may include information on whether the state of the memory device 100 is a ready state or busy state. The memory controller 200 may check a state of the memory device 100 through the status read response provided from the memory device 100 to the memory controller 200.

The status information received by the memory controller 200 may include fail information. The fail information may include information on whether an operation performed by the memory device 100 has passed or failed. Therefore, the fail information may represent whether a program operation or erase operation has passed or failed. The operating time calculator 211 may determine whether to measure an operating time based on the fail information.

The status information received by the memory controller 200 may include ready information. The ready information may include information on whether the state of the memory device 100 is a ready state or busy state. In an embodiment, the ready information may be set according to the ready busy signal.

Referring to FIG. 9, the operating time calculator 211 may determine whether to measure an operating time according to the status information included in the status read response.

Figure 17:
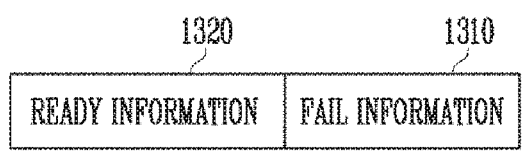
FIG. 17 is a diagram illustrating the status information of FIG. 16.

FIG. 17 is a diagram illustrating the status information of FIG. 16.

Referring to FIG. 17, the status information is data stored in the status register included in the memory device 100. The status information may include fail information 1310 and ready information 1320. The fail information may include information on whether an operation performed by the memory device 100 has passed or failed. The ready information may include information on whether the state of the memory device 100 is a ready state or busy state.

The fail information 1310 may include information on whether an operation performed by the memory device 100 has been passed or failed. Therefore, the fail information 1310 may include information on whether a program operation or erase operation has failed. The memory controller 200 may determine whether to measure a program operating time or erase operating time according to the fail information 1310.

The ready information 1320 may include information on whether the state of the memory device 100 is a ready state or busy state. Therefore, the ready information 1320 may include information on an end time of the program operation or an end time of the erase operation. The memory controller 200 may determine whether to measure a program operating time or erase operating time according to the ready information 1320.

Figure 18:
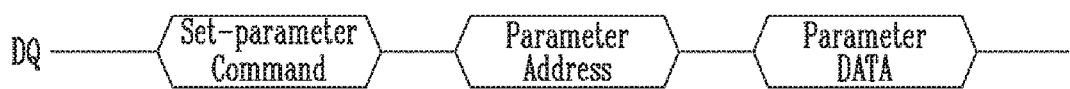
FIG. 18 is a diagram illustrating a method for changing, by the memory controller, a program voltage or erase voltage of the memory device.

FIG. 18 is a diagram illustrating a method for changing, by the memory controller 200, a program voltage or erase voltage of the memory device 100.

Referring to FIG. 18, the memory controller 200 may set an operating voltage, using a set-parameter command.

The memory controller 200 may provide the memory device 100 with a set-parameter command, a parameter address, and parameter data through the input/output lines DQ.

The set-parameter command may be a command for setting, as an operating voltage, data stored in a specific register among a plurality of registers included in the memory device 100.

When a program voltage is set, the parameter address may be an address of a register storing data about a program voltage. When an erase voltage is set, the parameter address may be an address of a register storing data about an erase voltage.

The memory device 100 may determine a program voltage for performing a program operation or an erase voltage for performing an erase operation. The parameter data may include values of the program voltage or the erase voltage.

Figure 19:
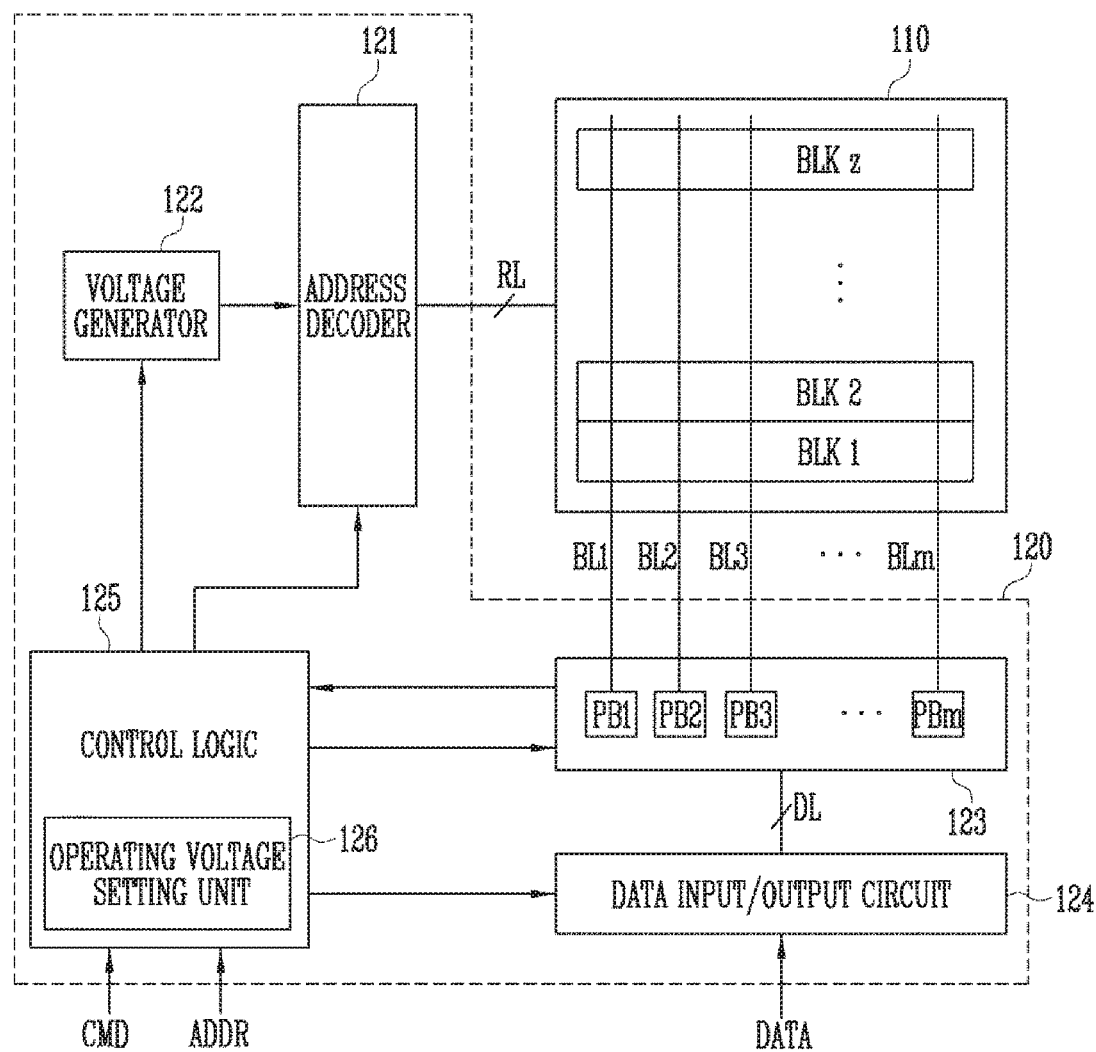
FIG. 19 is a block diagram illustrating a structure of the memory device of FIG. 1.

FIG. 19 is a block diagram illustrating a structure of the memory device of FIG. 1.

Referring to FIG. 19, the memory device 100 includes a memory cell array 110 and a peripheral circuit 120.

The memory cell array 110 may include a plurality of memory blocks BLK1 to BLKz. The plurality of memory blocks BLK1 to BLKz are coupled to an address decoder 121 through row lines RL, and are coupled to a read/write circuit 123 through bit lines BL1 to BLm. Each of the plurality of memory blocks BLK1 to BLKz includes a plurality of memory cells. In an embodiment, the plurality of memory cells are nonvolatile memory cells.

A plurality of memory cells included in the memory cell array may be divided into a plurality of blocks according to usage thereof. System information as various setting information necessary to control the memory device 100 may be stored in the plurality of blocks.

Each of first to zth memory blocks BLK1 to BLKz includes a plurality of cell strings. First to mth cell strings are coupled to first to mth bit lines BL1 to BLm, respectively. Each of the first to mth cell strings includes a drain select transistor, a plurality of memory cells coupled in series, and a source select transistor. The drain select transistor is coupled to a drain select line. First to nth memory cells are coupled to first to nth word lines. The source select transistor is coupled to a source select line. A drain side of the drain select transistor is coupled to a corresponding bit line. The drain select transistors of the first to mth cell strings are coupled to the first to mth bit lines BL1 to BLm, respectively. A source side of the source select transistor is coupled to a common source line. In an embodiment, the common source line may be commonly coupled to the first to zth memory blocks BLK1 to BLKz. The drain select line DSL, the first to nth word lines, and the source select line are included in the row lines RL. The drain select line DSL, the first to nth word lines, and the source select line are controlled by the address decoder 121. The common source line is controlled by a control logic 125. The first to mth bit lines BL1 to BLm are controlled by the read/write circuit 123.

The peripheral circuit 120 includes the address decoder 121, a voltage generator 122, the read/write circuit 123, a data input/output circuit 124, and the control logic 125.

The address decoder 121 is coupled to the memory cell array 110 through the row lines RL. The address decoder 121 is configured to operate under the control of the control logic 125. The address decoder 121 receives an address ADDR through the control logic 125.

In an embodiment, a program operation and a read operation of the memory device 100 are performed in units of pages.

In the program and read operations, the address ADDR received by the control logic 125 may include a block address and a row address. The address decoder 121 is configured to decode the block address in the received address ADDR. The address decoder 121 selects one memory block among the memory blocks BLK1 to BLKz according to the decoded block address.

The address decoder 121 is configured to decode the row address in the received address ADDR. The address decoder 121 selects one word line of a selected memory block by applying voltages provided from the voltage generator 122 to the row lines RL according to the decoded row address.

In an erase operation, the address ADDR includes a block address. The address decoder 121 decodes the block address, and selects one memory block according to the decoded block address. The erase operation may be performed on the whole or a portion of the one memory block.

In a partial erase operation, the address ADDR may include block and row addresses. The address decoder 121 selects one memory block among the memory blocks BLK1 to BLKz according to the block address.

The address decoder 121 is configured to decode the row addresses in the received address ADDR. The address decoder 121 selects at least one word line of the selected memory block by applying voltages provided from the voltage generator 122 to the row lines RL according to the decoded row addresses.

In an embodiment, the address decoder 121 may include a block decoder, a word line decoder, an address buffer, and the like.

The voltage generator 122 generates a plurality of voltages, using an external power voltage supplied to the memory device 100. The voltage generator 122 operates under the control of the control logic 125.

In an embodiment, the voltage generator 122 may generate an internal power voltage by regulating the external power voltage. The internal power voltage generated by the voltage generator 122 is used as an operating voltage of the memory device 100.

In an embodiment, the voltage generator 122 may generate a plurality of voltages, using the external power voltage or the internal power voltage.

For example, the voltage generator 122 may include a plurality of pumping capacitors for receiving the internal power voltage, and generate a plurality of voltages by selectively activating the plurality of pumping capacitors under the control of the control logic 130. The plurality of generated voltages are applied to word lines selected by the address decoder 121.

In a program operation, the voltage generator 122 may generate a high-voltage program pulse and a pass pulse lower than the program pulse. In a read operation, the voltage generator 122 may generate a read voltage and a pass voltage higher than the read voltage. In an erase operation, the voltage generator 122 may generate an erase voltage.

The read/write circuit 123 includes first to mth page buffers PB1 to PBm. The first to mth page buffers PB1 to PBm are coupled to the memory cell array 110 respectively through the first to mth bit lines BL1 to BLm. The first to mth page buffers PB1 to PBm operate under to control of the control logic 125.

The first to mth page buffers PB1 to PBm communicate data with the data input/output circuit 124. In a program operation, the first to mth page buffers PB1 to PBm receive data DATA to be stored through the data input/output circuit 124 and data lines DL.

In a program operation, when a program pulse is applied to a selected word line, the first to mth page buffers PB1 to PBm may transfer the data DATA received through the data input/out circuit 124 to selected memory cells through the bit lines BL1 to BLm. Memory cells of a selected page are programmed according to the transferred data DATA. A memory cell coupled to a bit line to which a program allow voltage (e.g., a ground voltage) is applied may have an increased threshold voltage. A threshold voltage of a memory cell coupled to a bit line to which a program inhibit voltage (e.g., a power voltage) may be maintained. In a program verify operation, the first to mth page buffers PB1 to PBm read page data from selected memory cells through the bit lines BL1 to BLm.

In a read operation, the read/write circuit 123 reads data DATA from memory cells of a selected page through the bit lines BL, and outputs the read data DATA to the data input/output circuit 124. In an erase operation, the read/write circuit 123 may float the bit lines BL.

In an embodiment, the read/write circuit 123 may include a column select circuit.

The data input/output circuit 124 is coupled to the first to mth page buffers PB1 to PBm through the data lines DL. The data input/output circuit 124 operates under the control of the control logic 125. In a program operation, the data input/output circuit 124 receives data DATA to be stored from an external controller (not shown).

The control logic 125 is coupled to the address decoder 121, the voltage generator 122, the read/write circuit 123, and the data input/output circuit 124. The control logic 125 may control overall operations of the memory device 100. The control logic 125 receives a command CMD and an address ADDR. The control logic 125 controls the address decoder 121, the voltage generator 122, the read/write circuit 123, and the data input/output circuit 124 in response to the command CMD.

The control logic 125 may include an operating voltage setting unit 126 so as to reset a program voltage for programming a plurality of memory cells included in the memory cell array 100 or reset an erase voltage for erasing any one memory block among the plurality of memory blocks BLK1 to BLKz included in the memory cell array 110.

Referring to FIG. 9, the operating voltage setting unit 126 may receive information of a program voltage or erase voltage from the memory controller 200, and reset a program voltage for programing a plurality of memory cells included in the memory cell array 110, using the received information of the program voltage, or reset an erase voltage for erasing any one memory block among the plurality of memory blocks BLK1 to BLKz included in the memory cell array 110 or the plurality of memory blocks BLK1 to BLKz, using the received information of the erase voltage. In a program operation, the operating voltage setting unit 126 may set a program voltage to a value higher or lower than that used in a previous program operation. In an erase operation, the operating voltage setting unit 126 may set an erase voltage to a value higher or lower than that used in a previous erase operation.

When a program voltage or erase voltage is reset by the operating voltage setting unit 126, the program voltage or erase voltage is reset according to a quantity of charges trapped in a tunnel oxide layer of memory cells included in a memory block, and hence the program operation or erase operation can be efficiently performed.

Figure 20:
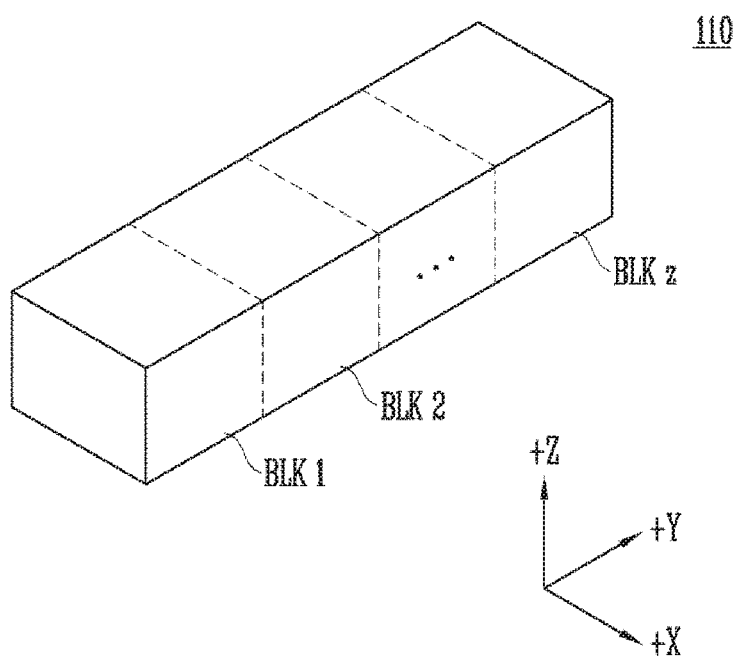
FIG. 20 is a diagram illustrating an embodiment of a memory cell array of FIG. 19.

FIG. 20 is a diagram illustrating an embodiment of the memory cell array of FIG. 19.

Referring to FIG. 20, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 21 and 22.

Figure 21:
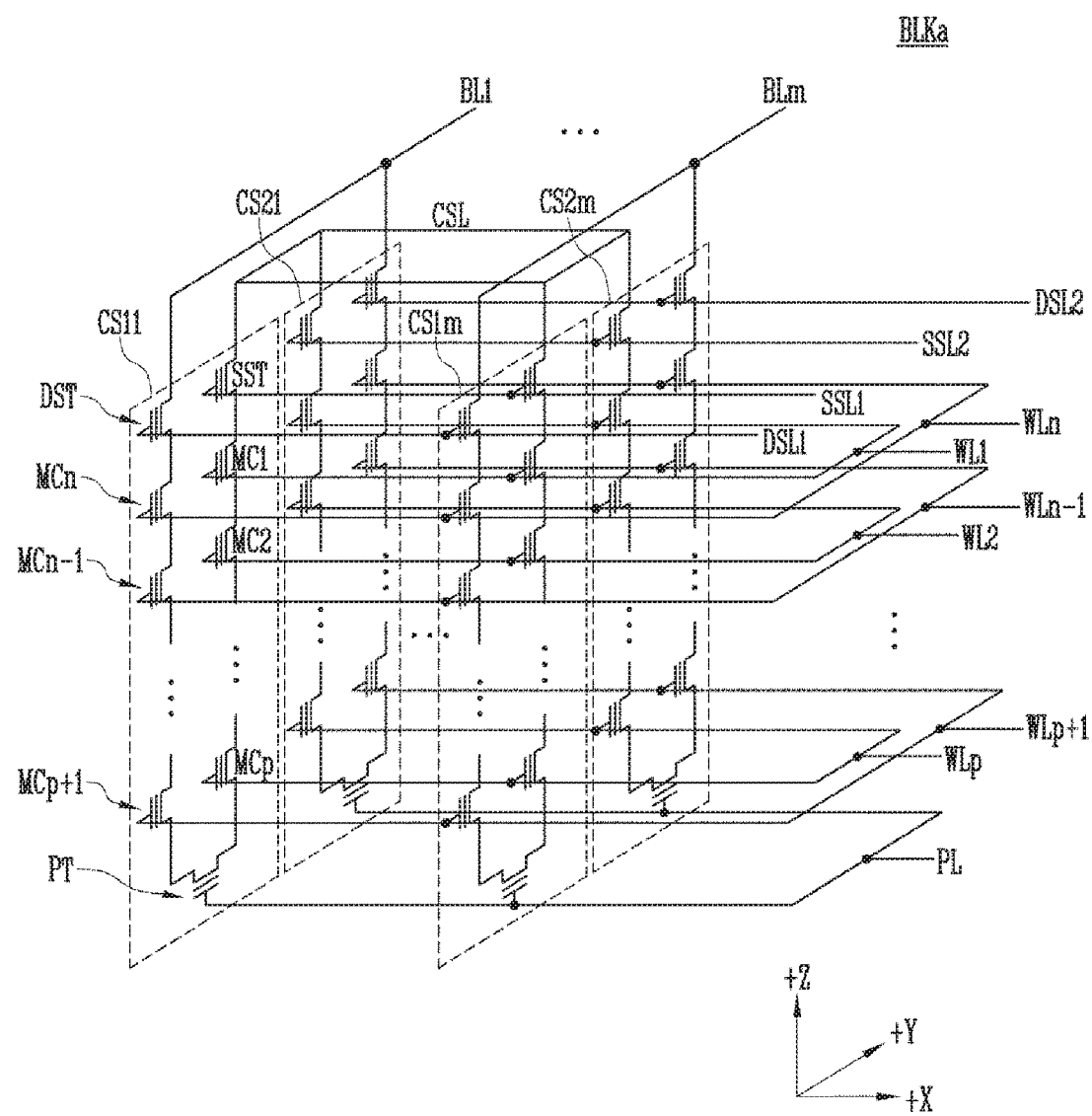
FIG. 21 is a circuit diagram illustrating any one memory block among memory blocks of FIG. 20.

FIG. 21 is a circuit diagram illustrating any one memory block BLKa among the memory blocks BLK1 to BLKz of FIG. 20.

Referring to FIG. 21, the memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). Although FIG. 21 illustrates two cell strings arranged in a column direction (i.e., a +Y direction), the present disclosure is not limited thereto. That is, two cell strings are illustrated in FIG. 21 for clarity; however, three cell strings or more may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 21, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 21, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the dummy memory cell(s), each may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 22:
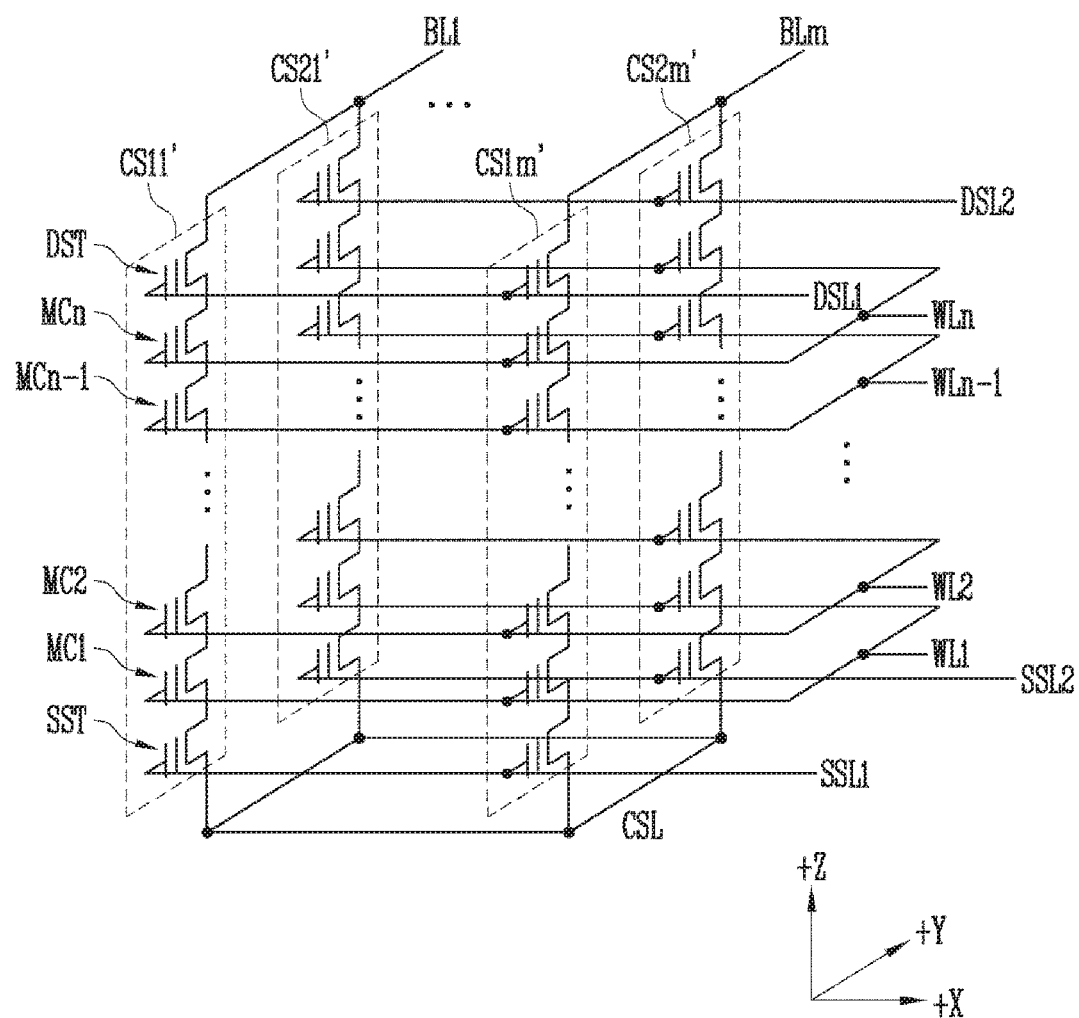
FIG. 22 is a circuit diagram illustrating another embodiment of the one memory block among the memory blocks of FIG. 20.

FIG. 22 is a circuit diagram illustrating another embodiment BLKb of the one memory block among the memory blocks BLK1 to BLKz of FIG. 20.

Referring to FIG. 22, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 22 has a circuit similar to that of the memory block BLKa of FIG. 21, except that the pipe transistor PT is excluded from each cell string in FIG. 22.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the dummy memory cell(s), each may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 23:
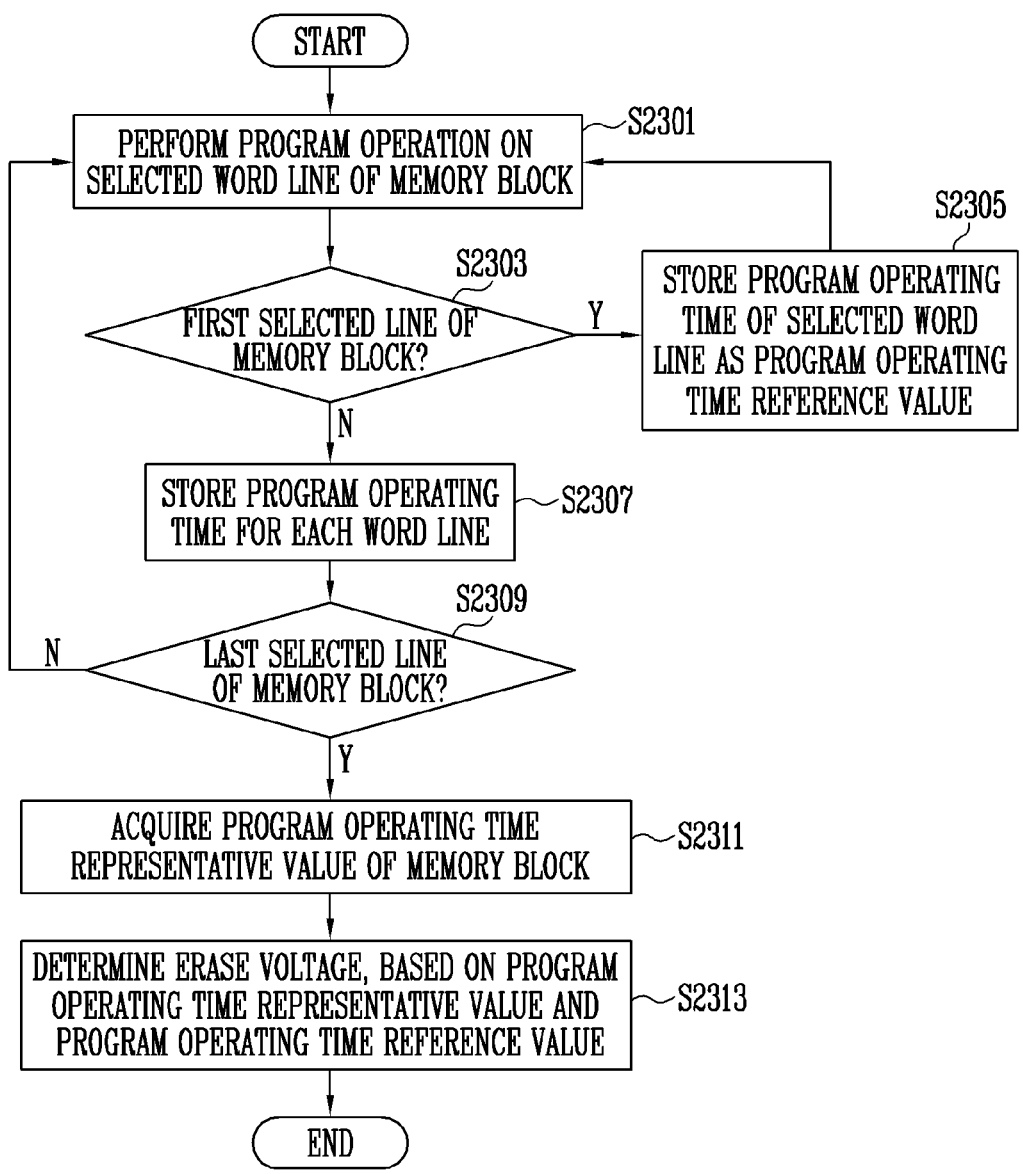
FIG. 23 is a diagram illustrating an operation of the memory device and the memory controller in accordance with an embodiment of the present disclosure.

FIG. 23 is a diagram illustrating an operation of the memory device 100 and the memory controller 200 in accordance with an embodiment of the present disclosure.

Referring to FIG. 23, in step S2301, the memory device 100 may perform a program operation on a selected word line among a plurality word lines coupled to a memory block.

In step S2303, the memory controller 200 may determine whether the selected word line is a first selected word line in the corresponding memory block. When the selected word line is first selected, the memory controller 200 proceeds to step S2305. When the selected word line is not first selected, the memory controller 200 proceeds to step S2307.

In the step 2305, when the selected word line is first selected word line in the memory block, the memory controller 200 may calculate a time taken for the memory device 100 to perform the program operation of the corresponding word line. The memory controller 200 may store the calculated time as a program operating time reference value tREF. The memory controller 200 may store the program operating time reference value tREF in the operating time storage 212. After the memory controller 200 stores the program operating time reference value tREF, the memory controller 200 proceeds back to the step S2301.

In the step S2307, when the selected word line is not first selected in the memory block, the memory controller 200 may calculate a time taken to perform the program operation for each word line. The memory controller 200 may store the calculated time in the operating time storage 212.

In step S2309, the memory controller 200 may determine whether the program operation has been performed on a last-selected word line, among the plurality of word lines coupled to the memory block. When the program operation is not performed on the last-selected word line, the memory controller 200 proceeds back to the step S2301 to perform the program operation until the memory controller 200 calculates a time taken to perform the program operation on the last-selected word line. When the program operation is performed on the last-selected word line, the memory controller 200 proceeds to step S2311.

In the step S2311, the memory controller 200 may acquire a program operating time representative value tREP of the memory block. The program operating time representative value tREP may correspond to an average value of program operating times of the other word lines, except the firstly selected word line, stored in the operating time storage 212.

In step S2313, the memory controller 200 may determine an erase voltage for the memory block, based on the program operating time representative value tREP and the program operating time reference value tREF. Specifically, the erase voltage may be determined by a difference value between the program operating time representative value tREP and the program operating time reference value tREF. For example, when the difference value of the program operating time is less than 0, the erase voltage may be determined as a value obtained by adding an offset voltage to a set default erase voltage. On the contrary, when the difference value of the program operating time is greater than 0, the erase voltage may be determined as a value obtained by subtracting the offset voltage from the set default erase voltage.

Figure 24:
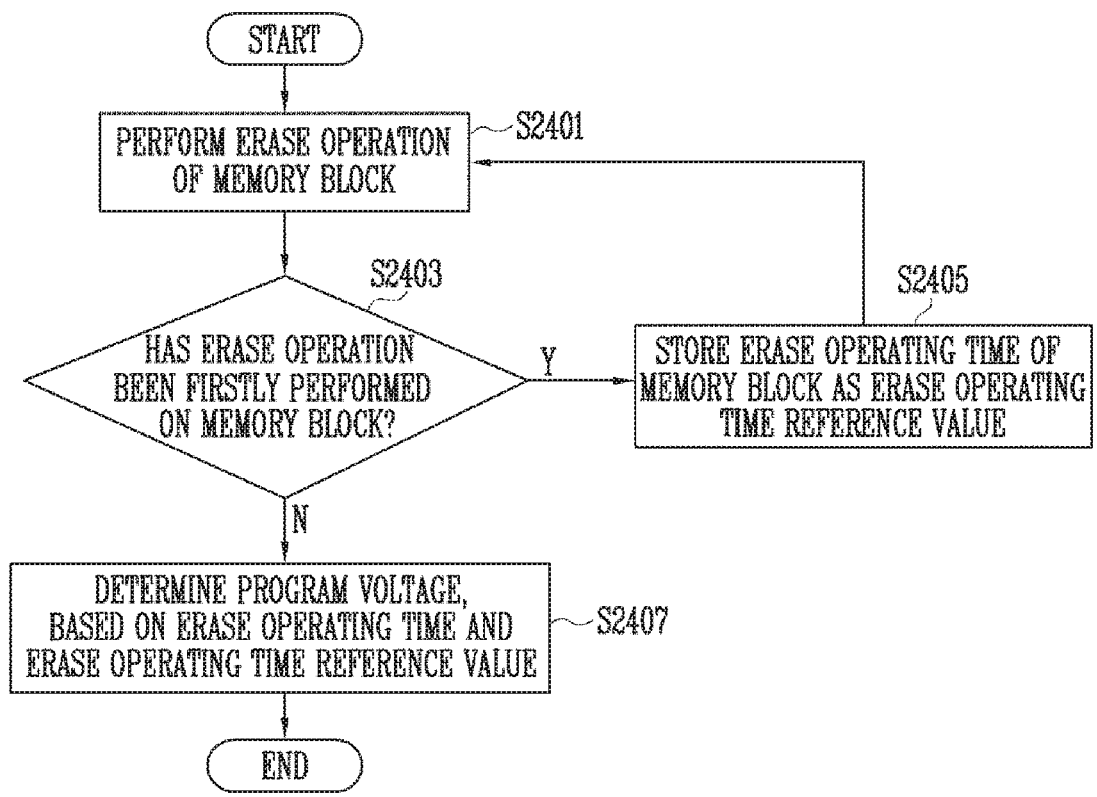
FIG. 24 is a diagram illustrating an operation of the memory device and the memory controller in accordance with an embodiment of the present disclosure.

FIG. 24 is a diagram illustrating an operation of the memory device 100 and the memory controller 200 in accordance with an embodiment of the present disclosure.

Referring to FIG. 24, in step S2401, the memory device 100 may perform an erase operation on a selected memory block among a plurality of memory blocks.

In step S2403, the memory controller 200 may determine whether the erase operation performed on the memory block was the first such operation, i.e., firstly performed. When the erase operation is firstly performed on the memory block, the memory controller 200 proceeds to step S2405. When the erase operation is not firstly performed on the memory block, the memory controller 200 proceeds to step S2407.

In the step S2405, when the erase operation is firstly performed on the memory block, the memory controller 200 may calculate a time taken for the memory device 100 to perform the erase operation. The memory controller 200 may store the calculated time as an erase operating time reference value. The memory controller 200 may store the erase operating time reference value in the operating time storage 212. After the memory controller 200 stores the erase operating time reference value in the operating time storage 212, the memory controller 200 returns to the step S2401.

In the step S2407, when the erase operation is not firstly performed on the memory block, the memory controller 200 may determine a program voltage, based on the time taken to perform the erase operation and the erase operating time reference value. Specifically, the program voltage may be determined by a difference value between an erase operating time of the corresponding memory block and the erase operating time reference value. For example, when the difference value of the program operating time is less than 0, the erase voltage may be determined as a value obtained by adding an offset voltage to a set default erase voltage. When the difference value of the program operating time is greater than 0, the erase voltage may be determined as a value obtained by subtracting the offset voltage from the set default erase voltage.

Figure 25:
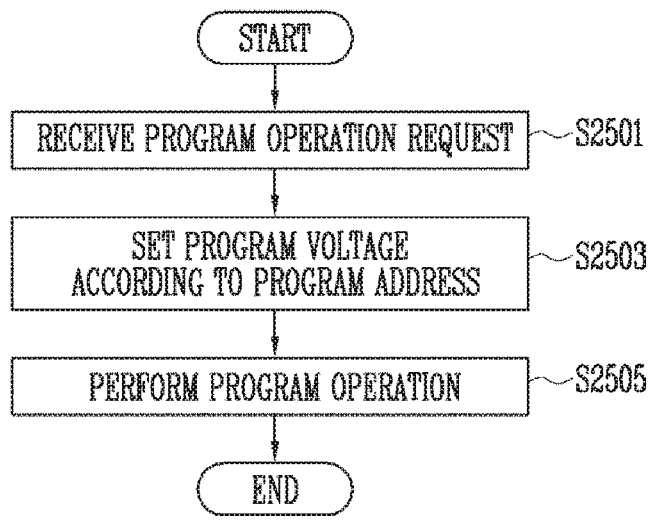
FIG. 25 is a diagram illustrating an operation of the memory device in accordance with an embodiment of the present disclosure.

FIG. 25 is a diagram illustrating an operation of the memory device 100 in accordance with an embodiment of the present disclosure.

Referring to FIG. 25, in step S2501, the memory device 100 may receive a program operation request from the memory controller 200. When the program operation request is received, the memory device 100 may perform a program operation.

In step S2503, the memory device 100 may receive a program address after the program operation request is provided from the memory controller 200. The program address may represent an area in which the memory device 100 performs the program operation. The memory device 100 may set a program voltage according to the program address. A program voltage for an area selected by the program address may be set by the operating voltage setting unit 126. The program voltage may be set according to a difference value between an erase operating time of a memory block corresponding to the program address except an erase operating time reference value of the corresponding memory block and the erase operating time reference value.

In step S2505, the memory device 100 may perform the program operation on memory cells coupled to a selected word line, using the set program voltage.

Figure 26:
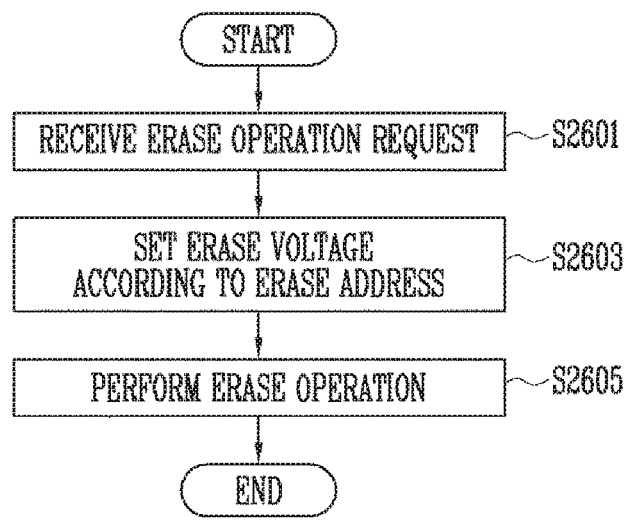
FIG. 26 is a diagram illustrating an operation of the memory device in accordance with an embodiment of the present disclosure.

FIG. 26 is a diagram illustrating an operation of the memory device 100 in accordance with an embodiment of the present disclosure.

Referring to FIG. 26, in step S2601, the memory device 100 may receive an erase operation request from the memory controller 200. When the erase operation request is received, the memory device 100 may perform an erase operation.

In step S2603, the memory device 100 may receive an erase address after the erase operation request is provided from the memory controller 200. The erase address may represent an area in which the memory device 100 performs the erase operation. The memory device may set an erase voltage according to the erase address. An erase voltage for an area selected by the erase address may be set by the operating voltage setting unit 126. The erase voltage may be set according to a difference value between a program operating time representative value tREP of a plurality of pages included in a memory block corresponding to the erase address and a program operating time reference value tREF.

In step S2605, the memory device 100 may perform the erase operation on the selected memory block, using the set erase voltage.

Figure 27:
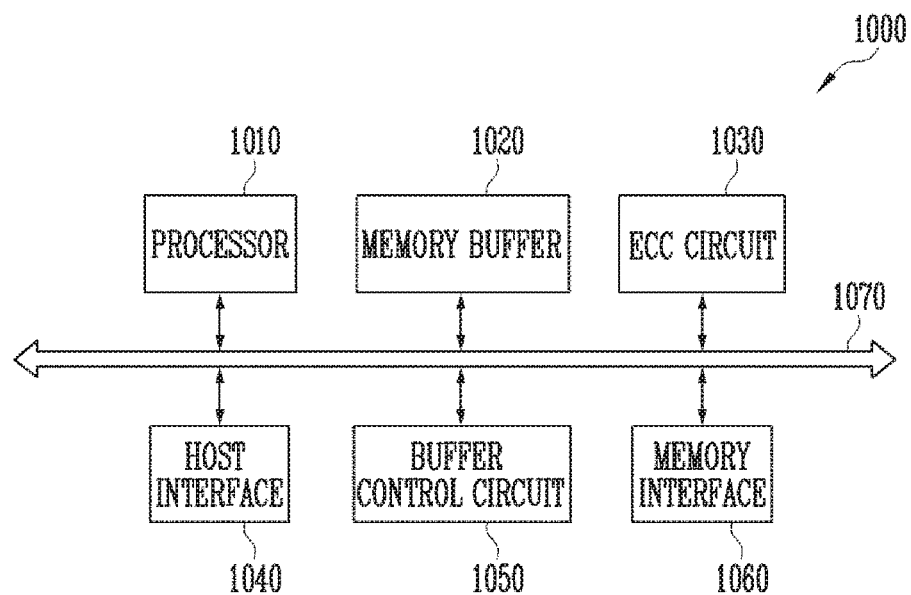
FIG. 27 is a diagram illustrating another embodiment of the memory controller of FIG. 1.

FIG. 27 is a diagram illustrating another embodiment of the memory controller of FIG. 1.

A memory controller 1000 is coupled to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

Referring to FIG. 27, the memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LBA, using a mapping table, to be translated into a PBA. Several address mapping methods of the FTL exist according to mapping units, including a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

In a read operation, the processor 1010 is configured to derandomize data received from the memory device. For example, the processor 1010 may derandomize data received from the memory device, using a derandomizing seed. The derandomized data may be output to the host.

In an embodiment, the processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010.

The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050, either of which may be provided, separately or its functions distributed within the memory controller 1000.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and may not interfere or influence with each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 28:
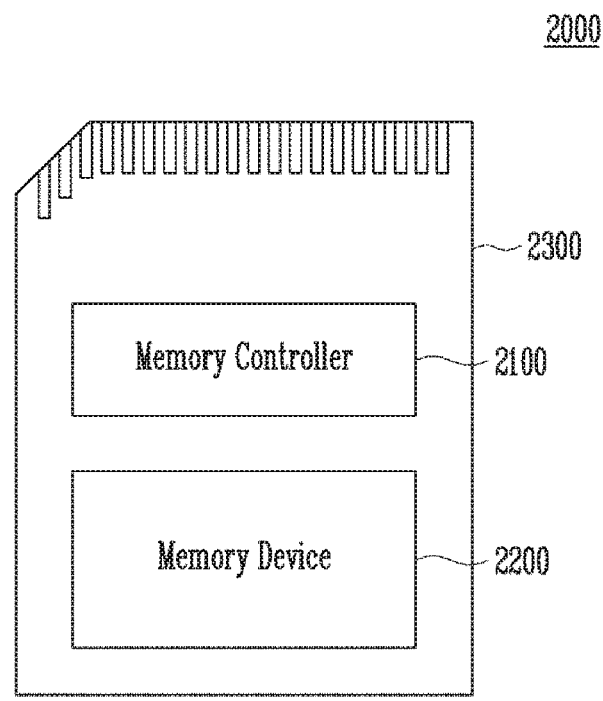
FIG. 28 is a block diagram illustrating a memory card system to which the storage device is applied in accordance with an embodiment of the present disclosure.

FIG. 28 is a block diagram illustrating a memory card system to which the storage device is applied in accordance with an embodiment of the present disclosure.

Referring to FIG. 28, the memory card system 2000 includes a memory controller 2100, a memory device, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to driver firmware for controlling the memory device 2200. The memory device 2200 may be implemented in the same way as the memory device 100 described with reference to FIG. 2.

In an example, the memory controller 2100 may include components such as a Random Access Memory (RAM), a processor, a host interface, a memory interface, and an ECC circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a Universal Serial Bus (USB), Multi-Media Card (MMC) an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented with various nonvolatile memory devices such as an Electrically Erasable and Programmable ROM (EPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card such as a PC card (Personal Computer Memory Card International Association (PCM-CIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and/or a Universal Flash Storage (UFS).

Figure 29:
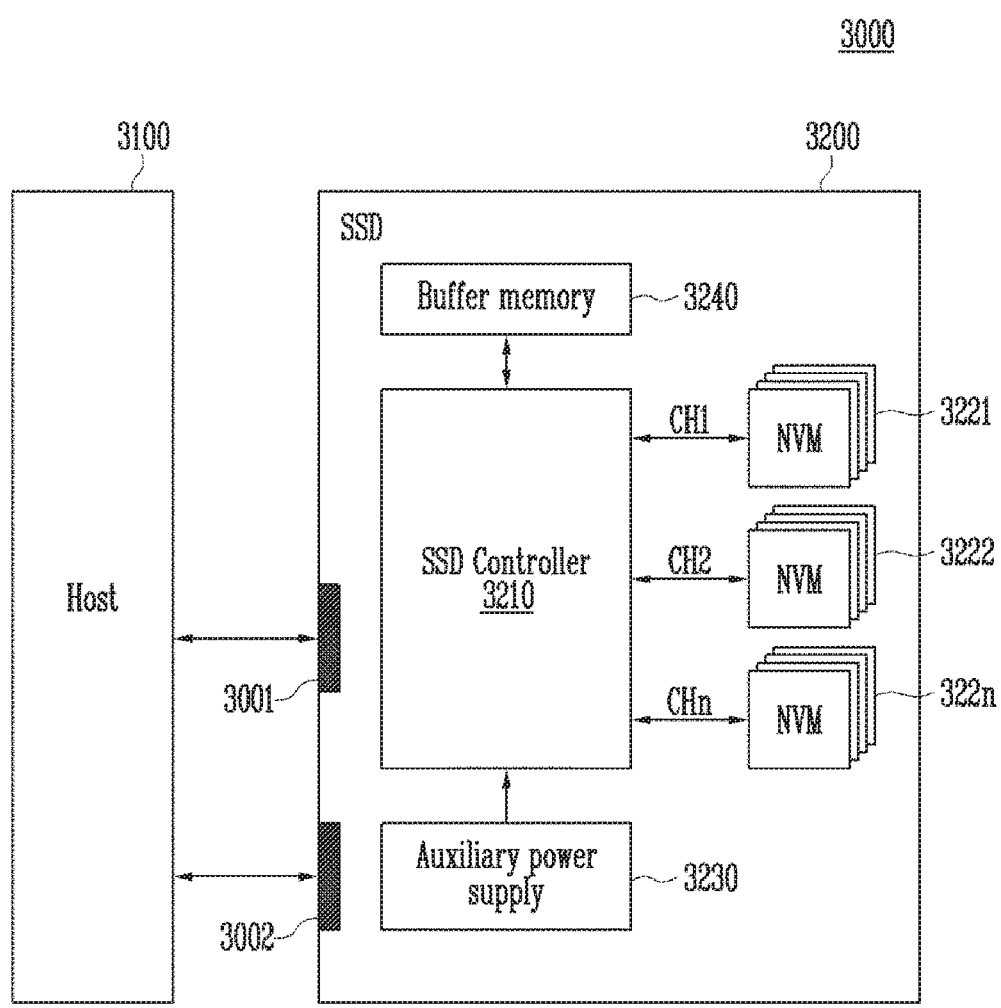
FIG. 29 is a block diagram exemplarily illustrating a Solid State Drive (SSD) to which the storage device is applied in accordance with an embodiment of the present disclosure.

FIG. 29 is a block diagram exemplarily illustrating a Solid State Drive (SSD) to which the storage device is applied in accordance with an embodiment of the present disclosure.

Referring to FIG. 29, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be based on an interface between the host 3100 and the SSD 3200. For example, the signal SIG may be defined by at least one of interfaces such as a Universal Serial Bus (USB), Multi-Media Card (MMC) an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200 or external to the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 30:
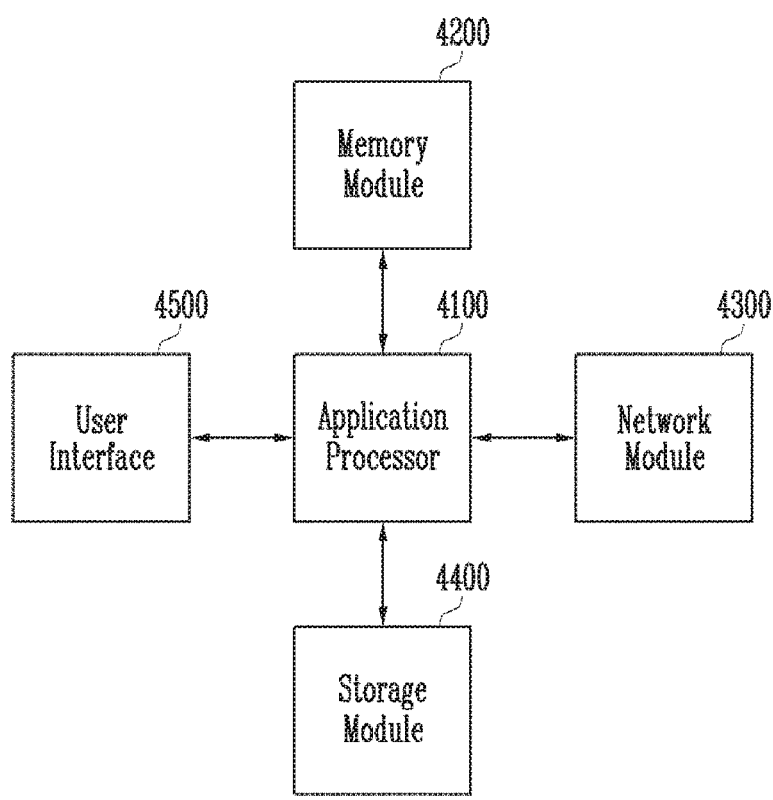
FIG. 30 is a block diagram illustrating a user system to which the storage device is applied in accordance with an embodiment of the present disclosure.

FIG. 30 is a block diagram illustrating a user system to which the storage device is applied in accordance with an embodiment of the present disclosure.

Referring to FIG. 30, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include one or more volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM, and/or one or more non-volatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

For example, the storage module 4400 may include a plurality of nonvolatile memory devices, and the plurality of nonvolatile memory devices may operate identically to the memory device described with reference to FIGS. 19 to 22. The storage module 4400 may operate in the same way as the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with embodiments of the present disclosure, a memory controller having improved reliability is provided.

While the present disclosure has been shown and described with reference to certain embodiments thereof, it will be understood by those skilled in the art in light of the present disclosure that various changes in form and details may be made therein without departing from the spirit and scope of the present disclosure as defined by the appended claims and their equivalents. Therefore, the scope of the present disclosure should not be limited to the above-described embodiments but should be determined by the appended claims and equivalents thereof.

In the above-described embodiments, all steps may be selectively performed or some of the steps may be omitted. In each embodiment, the steps need not necessarily be performed in accordance with the described order and may be rearranged. The embodiments disclosed in this specification and drawings are only examples to facilitate an understanding of the present disclosure. That is, it should be apparent to those skilled in the art that various modifications can be made on the basis of the technological scope of the present disclosure.

Although specific terminologies are used here, they are only to explain the embodiments of the present disclosure. Therefore, the present disclosure is not restricted to the above-described embodiments, as many modifications and variations are possible within the spirit and scope of the present disclosure. Such modifications and variations should be apparent to those skilled in the art on the basis of the technological scope of the present disclosure in addition to the embodiments disclosed herein.

What is claimed is:

1. A memory controller for controlling a memory device, the memory controller comprising:
   a processor configured to obtain an operating time of a first program operation performed on a word line, and obtain an average operating time of second program operations performed on at least two word lines different from the word line after the first program operation among a plurality of word lines coupled to a memory block included in the memory device;
   an operating time storage configured to store the operating time as a reference operating time, and store the average operating time; and
   an operating voltage controller configured to, based on a difference between the average operating time and the reference operating time, determine a level of an erase voltage to be applied to the memory block during an erase operation.

2. The memory controller of claim 1, wherein the processor is configured to obtain the operating time, and obtain the average operating time based on a ready busy signal received from the memory device.

3. The memory controller of claim 1, wherein the first program operation is a program operation performed firstly, among program operations corresponding to the plurality of word lines coupled to the memory block, respectively.

4. The memory controller of claim 1,
wherein the operating voltage controller is further configured to, in response to an erase command being received, control the memory device to apply the erase voltage with the determined level to the memory block.

5. The memory controller of claim 1,
wherein the at least two word lines comprise all word lines other than the word line among the plurality of word lines in the memory block.

6. The memory controller of claim 1,
wherein the operating voltage controller is configured to:
determine the level of the erase voltage by adding an offset level to a default level when the difference is less than 0; and
determine the level of the erase voltage by subtracting the offset level from the default level when the difference is greater than 0.

7. A memory controller for controlling a memory device, the memory controller comprising:
a processor configured to obtain an operating time of a first program operation performed on a word line, and obtain an average operating time of second program operations performed on at least two word lines different from the word line after the first program operation, among a plurality of word lines coupled to a selected memory block of a plurality of memory blocks included in the memory device, based on a ready busy signal received from the memory device;
an operating time storage configured to store the operating time as a reference operating time; and
an operating voltage controller configured to, based on a difference between the average operating time and the reference operating time, determine a level of an erase voltage to be applied to the selected memory block.

8. The memory controller of claim 7, wherein the first program operation is a program operation performed firstly, among program operations corresponding to the plurality of word lines coupled to the selected memory block, respectively.

9. The memory controller of claim 7, wherein the operating voltage controller is further configured to, in response to an erase command being received, control the memory device to apply the erase voltage with the determined level to the selected memory block.

10. The memory controller of claim 7, wherein the at least two word lines comprise all word lines other than the word line among the plurality of word lines in the selected memory block.

11. The memory controller of claim 7, wherein the operating voltage controller is configured to:
determine the level of the erase voltage by adding an offset level to a default level when the difference is less than 0; and
determine the level of the erase voltage by subtracting the offset level from the default level when the difference is greater than 0.

* * * * *